(12) United States Patent
Kelly et al.

(10) Patent No.: US 12,298,567 B2
(45) Date of Patent: May 13, 2025

(54) WAVEGUIDE NETWORK

(71) Applicant: Microsoft Technology Licensing, LLC, Redmond, WA (US)

(72) Inventors: Douglas James Kelly, Cambridge (GB); Benn Charles Thomsen, Cambridge (GB); Dushyanth Narayanan, Cambridge (GB); Antony Ian Taylor Rowstron, Cambridge (GB); Andreas Georgiou, Cambridge (GB)

(73) Assignee: Microsoft Technology Licensing, LLC, Redmond, WA (US)

( * ) Notice: Subject to any disclaimer, the term of this patent is extended or adjusted under 35 U.S.C. 154(b) by 1 day.

(21) Appl. No.: 17/904,788

(22) PCT Filed: Feb. 22, 2021

(86) PCT No.: PCT/US2021/018955
§ 371 (c)(1),
(2) Date: Aug. 23, 2022

(87) PCT Pub. No.: WO2021/194670
PCT Pub. Date: Sep. 30, 2021

(65) Prior Publication Data
US 2023/0048079 A1    Feb. 16, 2023

(30) Foreign Application Priority Data
Mar. 26, 2020 (EP) .................................. 20165944

(51) Int. Cl.
*G02B 6/35* (2006.01)
*G02B 27/28* (2006.01)
(Continued)

(52) U.S. Cl.
CPC .............. *G02B 6/3534* (2013.01); *G02B 6/35* (2013.01); *G02B 6/3512* (2013.01);
(Continued)

(58) Field of Classification Search
CPC ...... G02B 6/35; G02B 6/3512; G02B 6/3534; G11B 7/0065; G11B 1/135
See application file for complete search history.

(56) References Cited

U.S. PATENT DOCUMENTS

| 5,124,987 A | 6/1992 | Milligan et al. |
| 5,126,862 A | 6/1992 | Hong et al. |

(Continued)

FOREIGN PATENT DOCUMENTS

| CN | 1502064 A | 6/2004 |
| CN | 1540458 A | 10/2004 |

(Continued)

OTHER PUBLICATIONS

"Non Final Office Action Issued in U.S. Appl. No. 17/905,684", Mailed Date: Sep. 15, 2023, 7 Pages.

(Continued)

*Primary Examiner* — Daniel Petkovsek
(74) *Attorney, Agent, or Firm* — Barta Jones, PLLC

(57) ABSTRACT

A multimode optical waveguide network comprises a parent waveguide and a plurality of child waveguides. Each waveguide is a multimode optical waveguide having a first surface region, multiple second surface regions, and at least one guiding element attached to a surface of the waveguide or embedded within the waveguide, each second surface region of the parent waveguide optically coupled to the first surface region of a corresponding child waveguide. The guiding element(s) of the parent waveguide is arranged to guide a beam, from or to its first surface region, to or from any selected second surface region of its multiple second (Continued)

surface regions. The guiding element(s) of each of the waveguides is configurable for selecting the second surface region of that waveguide and/or responsive to at least one beam characteristic for selecting the second surface region of that waveguide via modulation of the at least one beam characteristic.

14 Claims, 12 Drawing Sheets

(51) Int. Cl.
G11B 7/0065 (2006.01)
G11B 7/135 (2012.01)
(52) U.S. Cl.
CPC ............ *G11B 7/0065* (2013.01); *G11B 7/135* (2013.01); *G02B 27/283* (2013.01)

(56) References Cited

U.S. PATENT DOCUMENTS

| | | | |
|---|---|---|---|
| 5,295,208 | A | 3/1994 | Caulfield et al. |
| 5,835,458 | A | 11/1998 | Bischel et al. |
| 6,205,107 | B1 | 3/2001 | Burr |
| 6,577,785 | B1 | 6/2003 | Spahn |
| 6,735,113 | B2 | 5/2004 | Yoon et al. |
| 7,127,574 | B2 | 10/2006 | Rotithor et al. |
| 7,315,501 | B1 | 1/2008 | Ramanujam |
| 7,557,971 | B1 | 7/2009 | Sigel et al. |
| 8,542,964 | B2 | 9/2013 | Meir et al. |
| 8,582,932 | B2 | 11/2013 | Krummrich |
| 8,743,464 | B1 | 6/2014 | Amirparviz |
| 9,091,806 | B2 | 7/2015 | Zheng et al. |
| 9,812,200 | B2 | 11/2017 | Intrater et al. |
| 9,851,905 | B1 | 12/2017 | Ramalingam et al. |
| 9,871,948 | B2 | 1/2018 | Papadopoulos et al. |
| 9,933,684 | B2 | 4/2018 | Brown et al. |
| 10,025,531 | B2 | 7/2018 | Yoon et al. |
| 10,033,477 | B2 | 7/2018 | Bratkovski et al. |
| 10,216,061 | B2 | 2/2019 | Popovich et al. |
| 10,401,883 | B2 | 9/2019 | Swanson et al. |
| 10,423,222 | B2 | 9/2019 | Popovich et al. |
| 10,459,145 | B2 | 10/2019 | Popovich et al. |
| 10,459,311 | B2 | 10/2019 | Popovich et al. |
| 11,281,013 | B2 * | 3/2022 | Popovich ........... G02B 27/0179 |
| 11,894,035 | B2 * | 2/2024 | Kelly ..................... G11B 7/135 |
| 11,984,145 | B2 * | 5/2024 | Chu ..................... G11B 7/0065 |
| 11,990,165 | B2 * | 5/2024 | Kelly ..................... G11B 7/135 |
| 2002/0075776 | A1 | 6/2002 | Kasazumi |
| 2003/0048975 | A1 | 3/2003 | Lackritz et al. |
| 2003/0086639 | A1 | 5/2003 | Ling |
| 2003/0108289 | A1 | 6/2003 | Zhang et al. |
| 2003/0137706 | A1 | 7/2003 | Rmanujam |
| 2004/0156083 | A1 | 8/2004 | Sugiki et al. |
| 2004/0240015 | A1 | 12/2004 | Newswanger et al. |
| 2005/0174618 | A1 | 8/2005 | Edwards |
| 2005/0185230 | A1 | 8/2005 | Kuroda |
| 2006/0193232 | A1 | 8/2006 | Redfield |
| 2007/0153345 | A1 | 7/2007 | Tsukagoshi et al. |
| 2007/0297032 | A1 | 12/2007 | Harvey et al. |
| 2008/0239428 | A1 | 10/2008 | Bell et al. |
| 2010/0259804 | A1 | 10/2010 | Buschbeck et al. |
| 2011/0116094 | A1 | 5/2011 | Allsop |
| 2012/0051204 | A1 | 3/2012 | Ohnishi |
| 2013/0077457 | A1 | 3/2013 | Usui et al. |
| 2015/0063089 | A1 | 3/2015 | Liu |
| 2015/0205034 | A1 | 7/2015 | Fcke et al. |
| 2017/0031851 | A1 | 2/2017 | Mirichigni et al. |
| 2018/0136383 | A1 | 5/2018 | Choi |
| 2018/0284460 | A1 * | 10/2018 | Cheng ................ G02B 27/0172 |
| 2018/0314437 | A1 | 11/2018 | Lesartre et al. |
| 2019/0113829 | A1 | 4/2019 | Waldern et al. |
| 2019/0129085 | A1 | 5/2019 | Waldern et al. |
| 2019/0212699 | A1 | 7/2019 | Waldern et al. |
| 2019/0305854 | A1 | 10/2019 | Campos et al. |
| 2019/0391243 | A1 | 12/2019 | Nicolaescu |
| 2023/0104873 | A1 | 4/2023 | Kelly et al. |
| 2023/0120717 | A1 | 4/2023 | Chu et al. |
| 2023/0360674 | A1 | 11/2023 | Kelly |
| 2024/0144969 | A1 | 5/2024 | Kelly |

FOREIGN PATENT DOCUMENTS

| | | |
|---|---|---|
| CN | 101025942 A | 8/2007 |
| CN | 101034280 A | 9/2007 |
| CN | 102831902 A | 12/2012 |
| CN | 103443700 A | 12/2013 |
| CN | 109154717 A | 1/2019 |
| CN | 110831478 A | 2/2020 |
| JP | H06110367 A | 4/1994 |
| JP | 20040044 A | 7/2003 |
| JP | 2003521744 A | 7/2003 |
| JP | 2003248416 A | 9/2003 |
| JP | 2003255418 A | 9/2003 |
| JP | 2005512128 A | 4/2005 |
| JP | 2005518556 A | 6/2005 |
| JP | 2005326710 A | 11/2005 |
| JP | 2006154163 A | 6/2006 |
| JP | 2013195802 A | 9/2013 |
| JP | 2013536451 A | 9/2013 |
| JP | 2016051979 A | 4/2016 |
| JP | 2019053127 A | 4/2019 |
| JP | 2019520595 A | 7/2019 |
| KR | 100626947 B1 | 9/2006 |
| KR | 20080033065 A | 4/2008 |
| KR | 20180117181 A | 10/2018 |
| WO | 0191127 A2 | 11/2001 |
| WO | 2009051775 A1 | 4/2009 |
| WO | 2011083018 A1 | 7/2011 |
| WO | 2011148460 A1 | 12/2011 |
| WO | 2013038193 A2 | 3/2013 |
| WO | 2013175525 A1 | 11/2013 |
| WO | 2015000965 A1 | 1/2015 |
| WO | 2017094369 A1 | 6/2017 |
| WO | 2018164914 A2 | 9/2018 |

OTHER PUBLICATIONS

"Non Final Office Action Issued in U.S. Appl. No. 17/905,850", Mailed Date: Sep. 12, 2023, 8 Pages.
"Notice of Allowance Issued in U.S. Appl. No. 17/906,793", Mailed Date: Sep. 19, 2023, 10 Pages.
Notice of Allowance mailed on Feb. 12, 2024, in U.S. Appl. No. 17/905,684, 3 pages.
Notice of Allowance mailed on Jan. 18, 2024, in U.S. Appl. No. 17/905,684, 6 pages.
"Extended European Search Report Issued in European Patent Application No. 20165926.5", Mailed Date: Sep. 24, 2020, 12 Pages.
"Extended European Search Report Issued in European Patent Application No. 20165935.6", Mailed Date: Sep. 24, 2020, 13 Pages.
"Extended European Search Report Issued in European Patent Application No. 20165944.8", Mailed Date: Sep. 4, 2020, 7 Pages.
"Extended European Search Report Issued in European Patent Application No. 20165954.7", Mailed Date: Sep. 24, 2020, 15 Pages.
Chen, et al., "Energy-Aware Writes to Non-Volatile Main Memory", In Journal of ACM SIGOPS Operating Systems Review, vol. 45, Issue 3, Oct. 23, 2011, 5 Pages.
Chiang, "Multiple-hologram recording with one-beam encoding", In Journal of Optics Express, vol. 20, Issue 7, Mar. 12, 2012, pp. 6897-6904.
Cizmar, et al., "Exploiting Multimode Waveguides for Pure Fibre-Based Imaging", In Journal of Nature Communications, vol. 3, Issue 1, Aug. 28, 2012, 9 Pages.
"International Search Report and Written Opinion Issued in PCT Application No. PCT/US21/018952", Mailed Date: May 31, 2021, 17 Pages.

(56) References Cited

OTHER PUBLICATIONS

"International Search Report and Written Opinion Issued in PCT Application No. PCT/US21/018954", Mailed Date: Jun. 9, 2021, 14 Pages.
"International Search Report and the Written Opinion Issued in PCT Application No. PCT/US21/018955", Mailed Date: May 14, 2021, 11 Pages.
"International Search Report and Written Opinion Issued in PCT Application No. PCT/US21/022269", Mailed Date: Jun. 24, 2021, 20 Pages.
Notice of Allowance mailed on Jan. 9, 2024, in U.S. Appl. No. 17/905,850, 8 pages.
Non-Final Office Action issued in U.S. Appl. No. 18/406,083, mailed on Sep. 17, 2024, 10 Pages.
Notice of Allowance mailed on Mar. 15, 2024, in U.S. Appl. No. 17/905,850, 02 pages.
Office Action Received for Chinese Application No. 202180024037.6, mailed on Mar. 29, 2024, 15 pages (English Translation Provided).
Final Office Action issued in U.S. Appl. No. 18/406,083, mailed on Jan. 7, 2025, 13 Pages.
Notice of Allowance mailed on Nov. 13, 2024, in U.S. Appl. No. 18/636,249, 8 pages.
Notice of Allowance mailed on Nov. 6, 2024, in U.S. Appl. No. 18/631,043, 10 pages.
Communication pursuant to Article 94(3) EPC, Received for European Application No. 21711983.3, mailed on Nov. 13, 2024, 4 pages.
Notice of Reasons for Refusal for Japanese Application No. 2022-547196, mailed on Dec. 26, 2024, 6 Pages. (English Translation Provided).
Communication Pursuant to Article 94(3) Received for European Application No. 21710852.1, mailed on Feb. 7, 2025, 12 pages.
Communication pursuant to Article 94(3) received in European Application No. 21716577.8, mailed on Feb. 18, 2025, 10 pages.
Decision to Grant for Japanese Application No. 2022549326, mailed on Jan. 23, 2025, 05 pages (English Translation Provided).
First Office Action Received for Chinese Patent Application No. 202180024715.9, mailed on Feb. 5, 2025, 22 Pages. (English Translation Provided)
Office Action Received for Japanese Application No. 2022-547893, mailed on Jan. 8, 2025, 10 pages (English translation Provided).
Communication under Rule 71(3) received in European Application No. 21710853.9, mailed on Feb. 18, 2025, 07 pages.
First Office Action Received for Chinese Application No. 202180024730.3, mailed on Mar. 13, 2025, 12 pages. (English Translation Provided)
Office Action Received for Korean Application No. 1020227034559, mailed on Mar. 21, 2025, 11 pages.
Office Action Received for Korean Application No. 1020227034720, mailed on Mar. 21, 2025, 22 pages.

\* cited by examiner

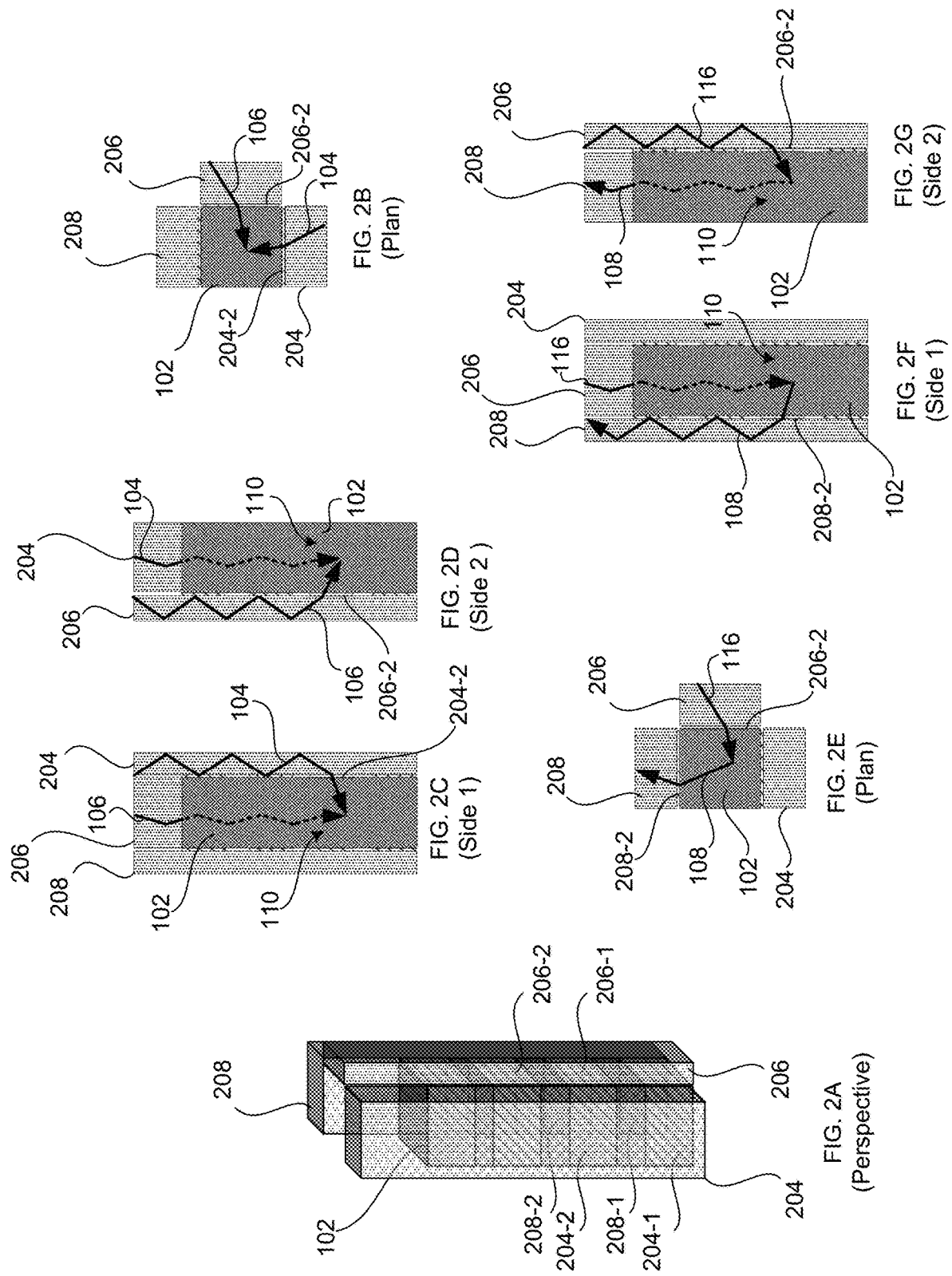

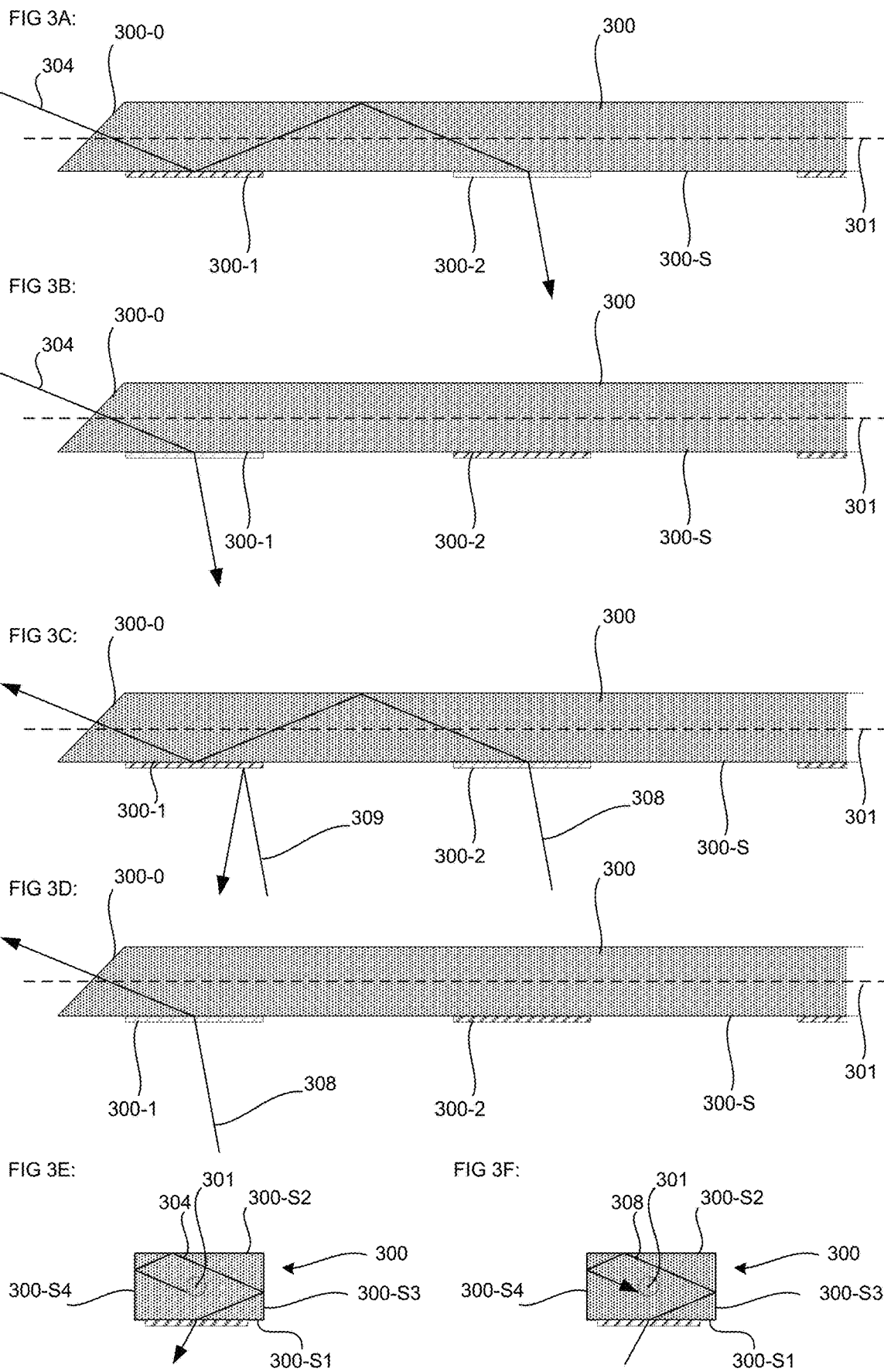

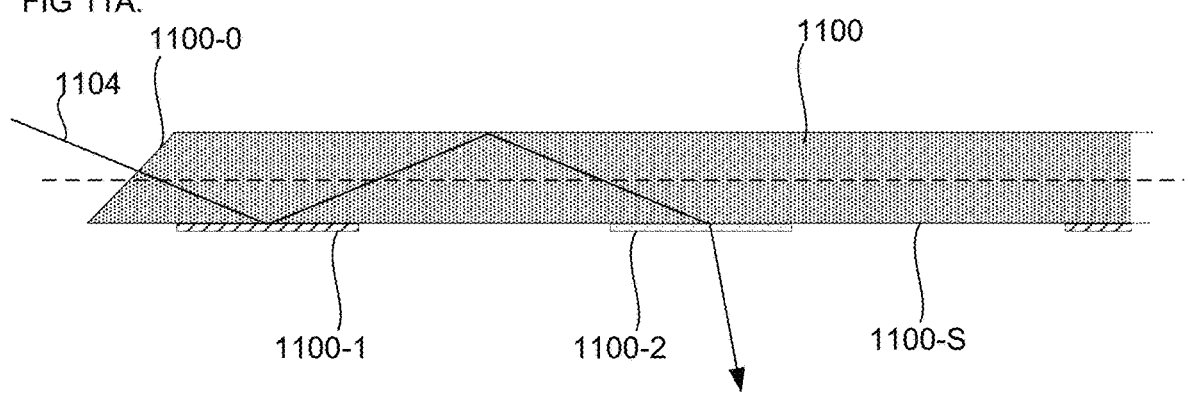
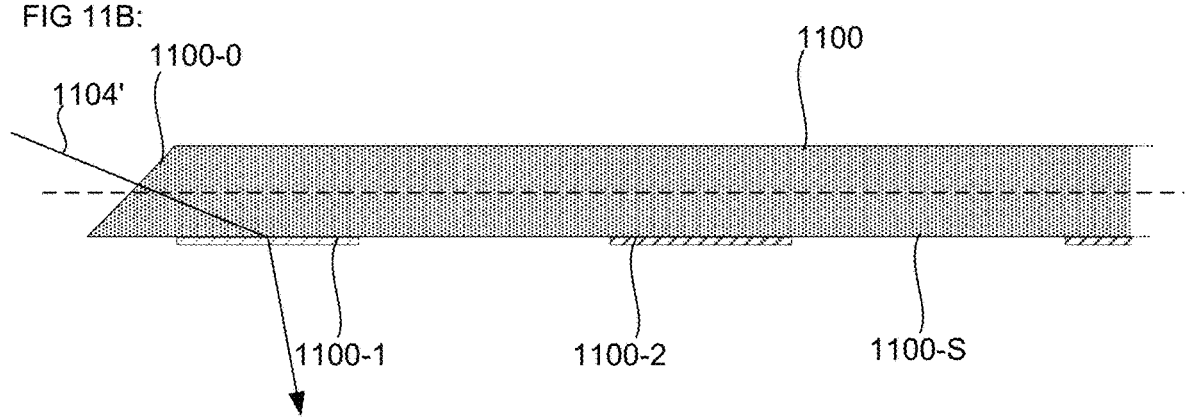

WAVEGUIDE NETWORK

TECHNICAL FIELD

The present disclosure pertains generally to optical waveguide technology.

BACKGROUND

An optical waveguide is a form of optical component that can guide beams via total internal reflection. A waveguide may be "multimode" in the sense of having physical dimensions sufficient to support a range of "modes" (i.e. spatial paths through the waveguide for a given channel, e.g. corresponding to different directions of propagation). This is in contrast to simple single-mode optical waveguides, such as thin optical fibres used in fibre optic system, where the aim is to restrict light entering a fibre to essentially a single propagation mode. Whereas a single-mode optical waveguide can only convey data using amplitude, phase or frequency modulation, a multimode optical waveguide allows more data (e.g. an entire image with potentially millions of pixels) to be conveyed by via angular variation within the waveguide. To put it another way, a multimode waveguide provides greater bandwidths through increased angular and/or spatial diversity, by providing multiple optical paths through the waveguide from emitter to detector for any given channel (the different paths corresponding to different propagation modes).

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

A multimode optical waveguide network comprises a parent waveguide and a plurality of child waveguides. Each of the parent and child waveguides is a multimode optical waveguide having a first surface region, multiple second surface regions, and at least one guiding element attached to a surface of the waveguide or embedded within the waveguide, each of the second surface regions of the parent waveguide being optically coupled to the first surface region of a corresponding one of the child waveguides. The at least one guiding element of the parent waveguide is arranged to guide a beam, from or to its first surface region, to or from any selected second surface region of its multiple second surface regions, the beam being coupled into or received from the corresponding child waveguide whose first surface region is optically coupled to that second surface region of the parent waveguide, via that second surface region of the parent waveguide and that first surface region of the corresponding child waveguide, the at least one guiding element of each child waveguide arranged to guide a beam, from or to its first surface region, to or from any selected second surface region of its multiple second surface regions. The at least one guiding element of each of the waveguides is configurable for selecting the second surface region of that waveguide and/or responsive to at least one beam characteristic for selecting the second surface region of that waveguide via modulation of the at least one beam characteristic.

The present multimode waveguide network facilitates more flexible spatial multiplexing in multiple data transfer contexts, across one or multiple spatial dimensions.

One example application of the present waveguide network is in a holographic data storage/retrieval system. Such systems would normally provide spatial multiplexing over a holographic recording medium, in the sense of being able to write to/read from different physical sub-volumes of the medium, via some form of mechanical actuator(s) to effect controllable mechanical movement of either the holographic medium, to move the medium relative to e.g. a read/write head of the system (from which the input and reference beams are emitted and at which the output beam is detected), or to move the read/write head relative to the medium. This, in turn, imposes limits on the speed at which data can be written/read, and also the scalability and reliability of such systems. One or more of the present multimode optical waveguide networks can be used to provide such multiplexing without the need for such mechanical actuators, where different regions may be read from or written to be controlling the guiding element(s) and/or modulating the beams. In this context, the multimode capabilities of the waveguide(s) may be used e.g. to read/write whole images simultaneously.

Other examples include optical communication or optical computation, where a multimode waveguide network may be used to multiplex over, say, different transmitters/receivers, signal converters/processors, optical processors etc.

BRIEF DESCRIPTION OF FIGURES

For a better understanding of the present disclosure, and to show how embodiments of the same may be carried into effect, reference is made by way of example only to the following figures in which:

FIG. 2A shows a schematic perspective view of a holographic storage system comprising a set of waveguides that may be used to guide beams to/from different sub-volumes of a holographic recording medium to provide spatial multiplexing over the medium;

FIGS. 2B, 2C and 2D show, respectively, plan and alternate side views of the system during a write interval;

FIGS. 2E-G shows plan and alternate side views during a read interval;

FIGS. 3A-3D show schematic side views of an active light pipe in various configurations; FIGS. 3E and 3F shows a plan (cross section) view of the active light pipe;

FIGS. 11A and 11B show a light pipe with passive optical filters having different frequency responses.

DETAILED DESCRIPTION OF EXAMPLE EMBODIMENTS

Figure 1A:
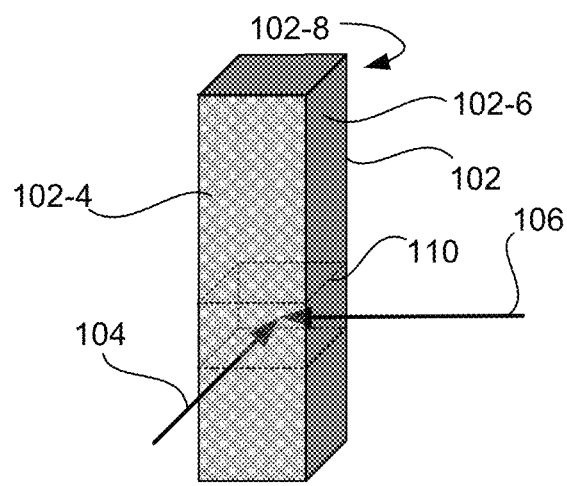
FIGS. 1A and 1B show schematic perspective views of a holographic recording medium.

One example application of the waveguide networks taught herein is holographic storage. Holographic storage is a form of computer storage, in which information is recorded in a light-sensitive holographic recording medium by exposing the medium to optical patterns. For example, a region (sub-volume) of the medium may be exposed to an optical interference pattern caused by interference between a reference beam and an input beam in which a set of data is embedded. The beams may, for example, be laser beams generated using a single laser and a beam splitter. Spatial light modulation (SLM) may be used to embed the set of data in the input beam, e.g. an image encoding the set of data may be spatially modulated into the input beam. For the avoidance of doubt, herein the terms "light", "optical" and the like are not restricted to visible light. Holographic storage can, for example, be implemented using infrared or ultraviolet beams within non-visible portions of the electromagnetic spectrum.

With sufficient beam power and exposure time, the optical interference pattern causes a persistent state change within the sub-volume (at this point, the interference pattern is said herein to be persistently recorded or written to the sub volume). The changed state of the sub-volume is such that, upon exposing the sub-volume to a substantially matching reference beam at a later time, the interaction between the matching reference beam and the sub-volume creates an output beam that essentially matches the original input beam, in the sense that the set of data originally embedded in the input beam can be recovered from the output beam (this may be referred to herein as reading the recorded pattern).

Rather than storing individual bits as discrete units, a single interference pattern can encode a large number (e.g. millions) of bits. For example, the set of data could be a megapixel image embedded in the input beam. Moreover, it is possible to record many such patterns (e.g. hundreds or thousands) to the same sub-volume, by exploiting the sensitivity of certain forms of holographic recording media to small changes in the angle of the reference beam. For such media, when an interference pattern is created with the reference beam at a given angle, the recorded pattern can only be read using a reference beam that closely matches the reference beam originally used to create it. This effect can be exploited to record multiple patterns (encoding different data sets) to the same sub-volume at different reference beam angles. Theoretically, the data storage capacity is limited only by the wavelength of the beams, with the potential to hundreds of megabytes per cubic millimetre for red light and tens of gigabytes for ultraviolet. In practice, there may be other limiting factors but there is nevertheless significant potential for high-density data storage.

In order to achieve spatial multiplexing over one or more holographic storage media, in a way that reduces or eliminates the need for mechanical movement, "active" light pipes, "passive" light pipes or a combination of active and passive light pipes can be used. Note, the terms "waveguide" and "light pipe" are used interchangeably herein, An "active light pipe" refers to a waveguide which has one or more active switching elements or other guiding elements attached to the surface of the waveguide or within the bulk of the waveguide, which in turn are configurable (i.e. have changeable optical properties) to effect "one-to-many" optical transfer, i.e. where light is guided from a first surface region to one of multiple possible second surface regions (in this case, the first surface region acts as an in-coupling region and the second regions act as out-coupling regions), or "many-to-one" optical transfer, i.e. where light can be guided from any one of the second surface regions (now acting as in-coupling regions) to the same first surface region (now acting as an out-coupling region). The term "passive light pipe" refers to a light pipe with guiding elements, having different optical sensitivity (e.g. different wavelength and/or polarization sensitivity), so that similar effect can be achieved by instead varying an optical characteristic(s) or the beam (e.g. varying its wavelength, polarization etc. to cause it to be guided along different routes by the guiding elements with different wavelength/polarization responses etc.; e.g. using a tuneable laser). The term "passive light guide" is merely a convenient label, consistent with the fact that, in this case, the guiding elements are not required to be active—however, active or passive guiding elements with different optical sensitivity (e.g. different wavelength and/or polarization sensitivity etc.) could be used in this context (that is, the guiding elements could be both active and have different optical sensitivities).

A digital image (or data encoded as a digital image) may be propagated as a beam along an active or passive light pipe. The guiding elements of the active light pipe can be individually controlled to either transmit or reflect an incident beam of light.

Many such light pipes (active, passive or a combination of both types) can be combined in various geometries to create a switching network that can be used to steer the beams and images to one of many addressable locations, in one or multiple spatial dimensions. The input to a light pipe can be created using a spatial light modulator (SLM) and the output read out on a CCD (charge-coupled device), for example. Phase interference and noise can be corrected using a combination of optical and computation techniques, including machine learning techniques, which would involve the learning of one or more signal processing parameters from training data. Certain embodiments use coherent detection in combination with such techniques to provide more effective waveguide distortion mitigation.

In contrast to optical switches and fibres of the kind traditionally used in optical data communication, the described embodiments use light pipes that are able to transfer an entire image at a time. This exploits the high resolution of optical devices available today such as SLMs and digital cameras. These devices have many millions of pixels allowing megabytes of data to be encoded and decoded. This allows high bandwidth transmission even with modest switching rates for the SLMs, cameras, and active light pipe elements (in the case of active light pipes) or beam optical characteristics(s) (in the case of passive light pipes). In addition, applications such as holographic storage require interference between multiple beams, at least one of which is modulated with an image. In holographic storage, using active light pipes the beams and images can be efficiently steered, and made to interfere, at any desired location in a holographic storage medium. As noted, simpler benefits can be achieved with passive light pipes, where the switching is applied at the emitter stage instead.

The light pipes described below are "multimode" waveguides in the sense of having physical dimensions sufficient to support a range of "modes" (i.e. spatial paths through the waveguide for a given channel, e.g. corresponding to different directions of propagation). This is in contrast to simple single-mode optical waveguides, such as thin optical fibres used in fibre optic system, where the aim is to restrict light entering a fibre to essentially a single propagation mode. Whereas a single-mode optical waveguide can only convey data using amplitude, phase or frequency modulation, a multimode optical waveguide allows more data (e.g. an entire image with potentially millions of pixels) to be conveyed by via angular variation within the waveguide. To put it another way, a multimode waveguide provides greater bandwidths through increased angular and/or spatial diversity, by providing multiple optical paths through the waveguide from emitter to detector for any given channel (the different paths corresponding to different propagation modes).

Another aspect disclosed herein is a holographic data storage system which uses one or more waveguide networks to spatially multiplex over a holographic recording medium (i.e. read and write from/to different sub-volumes of the media) without requiring any relative mechanical movement between the media and the waveguide network(s). An example of such a system is described below, which makes use of active and/or passive light pipes. In the described examples, a multimode waveguide can be used to carry an entire digital image to/from a holographic recording medium simultaneously, or to carry a reference beam at one of multiple possible angles.

The optical waveguide networks taught herein are not, however, limited in their application to holographic storage. Other applications include, for example, optical communication and optical computation.

Active Light Pipes:

FIGS. 3A-D show a schematic side-view of an example form of active light pipe 300 having a particular physical structure. As will be appreciated, this is merely one example of a suitable physical structure that can provide the desired optical configurability. Further examples are considered below.

The active light pipe 300 is shown to have at least first surface region 300-0 and multiple active switches in the form of switchable Bragg gratings (SBGs), which could be on the surface or volume-embedded. Two such SBGs 300-1, 300-2 are shown on a first surface 300-S1 of the waveguide 300 in this example, but it will be appreciated that there may be a greater number of SBGs disposed at suitable locations on the surface 300-S1 of the waveguide 300 and/or embedded within the bulk of the waveguide 300. Each SBG 300-1, 300-2 can be individually controlled to change its reflective/transmissive properties so as to either transmit or reflect an incident beam. The SBGs 300-1, 300-2 form respective surface regions of the active light pipe 300, at which light can enter the waveguide 300 (in-coupling) or exit the waveguide 300 (out-coupling) depending on how the waveguide 300 is used.

The first surface region 300-0 is an end region of the waveguide 300, from which the first side surface 300-S1 of the waveguide extends along an axis 301 of the waveguide 300.

FIGS. 3E and 3F each show a cross section view of the waveguide 300, which can be seen, in this example, to have a rectangular shape in cross section, with four side surfaces 300-S1, 300-S2, 300-S2, 300-S4 extending along the axis 301 of the waveguide 300. In this example, the SBGs 300-1, 300-2 are all located along the first of the side surfaces 300-S1, as depicted in the figures, though in general such SBGs could be attached to multiple surfaces of the waveguide 300 depending on the application.

The SBGs 300-1, 300-2 are located along the first side surface of waveguide 300-S1 at increasing distances from the first region 300-0, with a first SBG 300-1 located closest to the first region 300-0.

FIGS. 3A, 3B and 3E depict a "one-to-many" use case, in which the first surface region 300-0 acts as an in-coupling region and the second surface regions of the SBGs 300-1, 300-2 act as out-coupling regions. By way of example, FIG. 3 shows a first ray 304 that is coupled into the waveguide 300 via the in-coupling region 300-0. In this example, the first surface region 300-0 is angled relative to the side surfaces 300-S1, ..., 300-S4 such that the first ray 304 can pass through the first surface region 300-0 into the bulk of the waveguide 300 at an angle sufficient to achieve total internal reflection at each of the side surfaces 300-1, ..., 300-4 within the waveguide 300.

Each of the SBGs 300-1, 300-2 is configurable to change it between a reflective state and a transmissive state. FIG. 3A shows a configuration in which the first SBG 300-1 is in a reflective state, causing the incident ray 300 to be reflected from it, back into the waveguide 300, and guided along the waveguide 300 until reaching the second SBG 300-2. The SBG 300-2 is shown in a transmissive state, causing the ray 304 to be diffracted out of the waveguide 300 via the second SBG 300-2, and thereby coupled out of the waveguide 300 via the surface region of the second SBG 300-2. This configuration of the SBGs 300-1, 300-2 creates a "channel" through the waveguide 300 between the first surface region 300-0 and the surface region of the second SBG 300-2.

In contrast, FIG. 3B shows the first SBG 300-1 in a transmissive state. Hence the first ray 304, upon reaching the first SBG 300-1, is instead diffracted out of the waveguide 300 via the first SBG 300-1, and thereby coupled out of the waveguide 300 via the surface region of the first SBG 300-1 instead. This configuration creates a channel through the waveguide 300 between the first surface region 300-0 and the surface region of the first SBG 300-1.

In this manner, it is possible to guide a first ray 304 through the waveguide 300 from the first region 300-0 and out of the waveguide 300 at the surface region of any of the SBGs 300-1, 300-2. Although described in relation to only two SBGs 300-1, 300-2 for the sake of simplicity, it will be appreciated that the same principles can be applied with a greater number of SBGs.

FIG. 3E shows how the first ray 304 might propagate when viewed in cross section, via TIR from some or all of the side surfaces 300-S1, ..., 300-S4 depending on the angle of the first ray 304.

It is equally viable to use the depicted active light pipe 300 for many-to-one optical transfer, as depicted in FIGS. 3C, 3D and 3F.

FIG. 3C shows the same configuration of the SBGs as FIG. 3A. The only difference is how the waveguide 300 is used: now a second ray 308 is shown incident on the second SBG 300-2 from an external source (not shown). With the second SBG in a transmissive state, the second ray 308 is diffracted into the waveguide 300 via the second SBG (now providing in-coupling at its surface region), from which it is guided through the waveguide 300 to the first surface region 300-0 (now an out-coupling region); this includes reflection from the first SBG 300-1 currently in a reflective state. The reflective state of the first SBG 300-1 prevents the ray 308 from exiting the waveguide via the first SBG 300-1. Moreover, any external ray 309 that might happen to be incident on the first SBG 300-1 will be essentially reflected away from it and thus not enter the waveguide 300.

FIG. 3D shows the same configuration as FIG. 3B, but now with the second ray 308 incident on the first SBG 300-1 from an external source. With the first SBG 300-1 in a transmissive state, the third ray 310 enters the waveguide 300 thereat by diffraction, and is guided to the first surface region 300-0.

FIG. 3F shows how the second ray 308 might propagate within the waveguide 300 in cross section, and the same description of FIG. 3E applies but with the ray direction reversed.

The above description assumes perfect reflectivity/transmittivity of the SBGs in the transmissive/reflective states. As will be appreciated, this is not an absolute requirement in practice, and the system will have some tolerance to imperfections in the SBGs 300-1, 300-2 and the waveguide 300 more generally. Suitable signal processing techniques for compensating for distortion introduced within the waveguide 300 are describe later.

Although depicted as separate elements, the SBGs 300-1, 300-2 could in fact be separate, independently controllable regions of a single large SBG extending over all or most of the first side surface 300-S1.

SBGs are merely one possible form of active switching element. For example, with polarized beams, the same effects could be realized using controllable polarization filters, attached to the surface of the waveguide 300 or embedded within the bulk of the waveguide. SBGs and controllable polarization filters are examples of non-mechanical active switches which can change the optical properties of the waveguide 300 via non-mechanical effects. Other examples of guiding elements include controllable mirrors such as micro mirror devices or other microelectromechanical systems (MEMs), the latter being examples of mechanical guiding elements.

When using polarization filters as guiding elements, the SBGs 300-1, 300-2 could be replaced with passive diffractive elements, with the polarization filters acting to guide beams to or away from the passive diffractive elements as needed in a controllable fashion, without needing to reconfigure the diffractive elements.

Note that even when the guiding elements themselves are mechanical, this still avoids the need for mechanical movement of the waveguide 300 as a whole.

Active Light Pipe Network

Herein, a "waveguide network" can take the form of a single waveguide or multiple intercoupled waveguide networks. Waveguide networks with multiple active light pipes have particular benefits in terms of flexible optical data transfer.

Figure 4A:
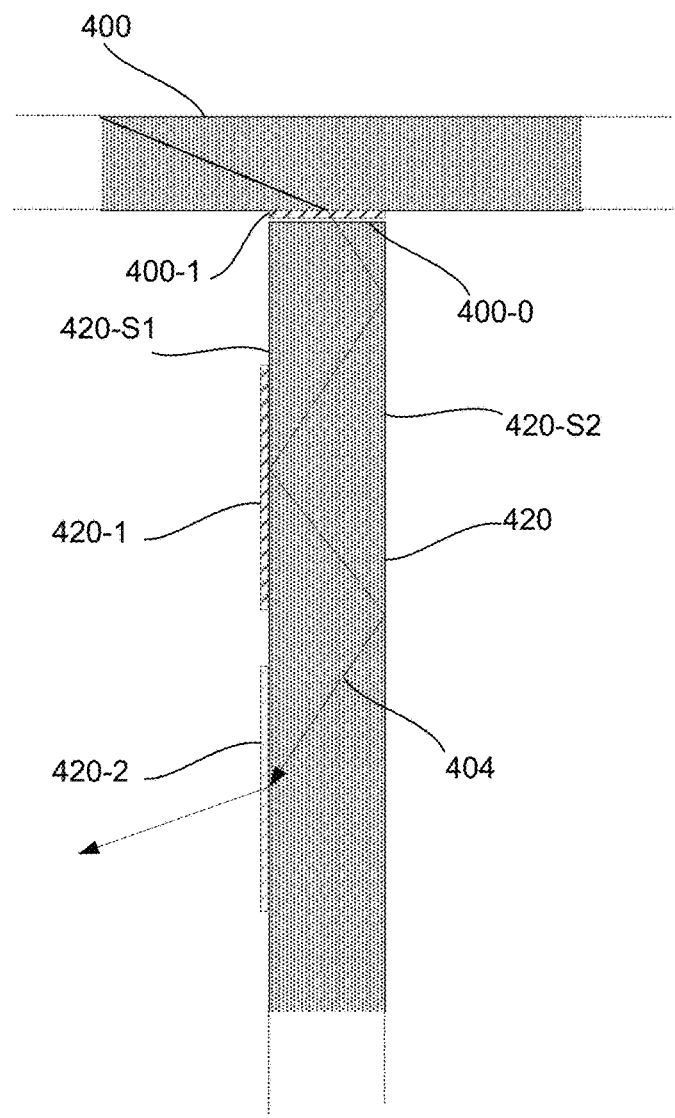
FIGS. 4A and 4B show alternate side views of (part of) an optical waveguide network.
Figure 4B:
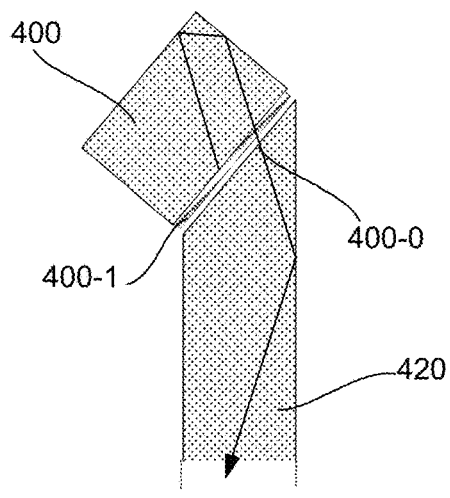

FIGS. 4A and 4B shows alternate side views of (part of) a waveguide network comprising first and second active light pipes 400, 420. The second light pipe 420 has a first surface region 420-0 located adjacent and aligned with a corresponding surface region of the first light pipe 400 for receiving a beam from or guiding a beam to the second waveguide 420 via the first surface region 400-0. Purely by way of example, a ray 404 is shown propagating through the first waveguide 400 to the corresponding surface region of the first waveguide 400 that lies adjacent the first surface region 420-0 of the second waveguide 420. The ray 404 is coupled out of the first waveguide 400 via an SBG 400-1 attached to the adjacent surface region of the first waveguide 400, and into the second waveguide 420 via the first surface region 400-0. From there, it can be guided to any one of multiple SBGs 420-1, 420-2 of the second waveguide 420 in a one-to-many fashion. The same arrangement can be used to guide a beam in the other direction, from the second waveguide 420 into the first waveguide 400, in a many-to-one fashion, with the ray direction reversed.

Whilst this example considers two intercoupled waveguides 400, 402, the principles can be applied to a greater number of inter-coupled waveguides to allow flexible data routing through the waveguide network.

More generally, a surface region of a medium may be otherwise optically coupled to a corresponding surface region of a waveguide, for example via an air interface or one or more other optical components (which could themselves be waveguides that may or may not provide active or passive switching functionality).

Holographic Storage

An application of active light pipes to holographic storage will now be described.

Figure 1B:
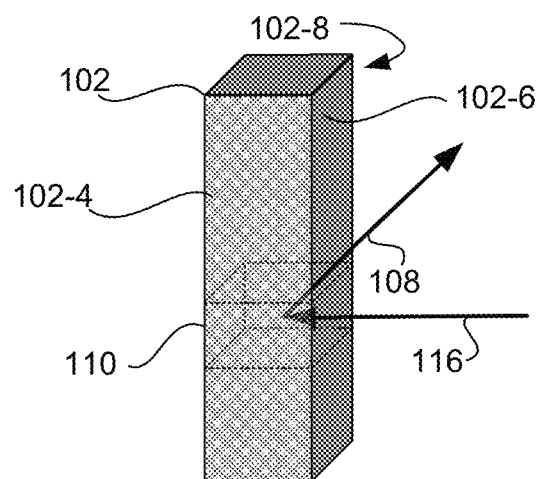

FIGS. 1A and 1B show schematic perspective views of a holographic recording medium 102, which is a volume of relatively thick, photosensitive material capable of persistently storing optical patterns as "holograms" embodied within the holographic recording medium 102 (which may be referred to as simply a medium 102 for conciseness). A hologram is created by exposing a sub-volume 110 (region) of the medium 102 to an optical pattern in a way that causes a persistent state change within that sub-volume 110. The hologram created with the sub-volume 110 by that state change records the optical pattern to the medium 102 such that the optical pattern can be reproduced therefrom at a later time. The hologram is persistent in that, once created, the medium 102 does not require power to maintain it. The composition and structure of the medium 102 may be such that a hologram cannot be erased once created and therefore provides a form of "write once read many" (WORM) storage, or it may be that holograms can be erased and replaced (but persist unless and until they are erased).

A single hologram can record an optical pattern that encodes a very large number (e.g. millions) of bits, allowing very large volumes of data to be written to/read from the holographic recording medium 102 in parallel (simultaneously). Another benefit of holographic storage is that many holograms can be written to the same sub-volume 110 of the holographic recording medium 102, which greatly increases the data storage capacity of the holographic recording medium 102 per unit volume.

In more detail, FIG. 1A shows how, in order to write a set of data to the medium 102, an input beam 104 and a reference beam 106 are directed into the sub-volume 110, via first and second side surfaces 102-4, 102-6 of the medium 102 respectively. This creates an optical pattern in the form of an interference pattern caused by interference between the input beam 104 and the reference beam 106. Provided the beams 104, 106 have sufficient power and the sub-volume 110 is exposed for a sufficient duration, the interference pattern created by the interfering beams 104, 106 will be persistently recorded within the sub-volume 110 as a hologram. A set of data is embedded in the input beam 104 and can be recovered from the resulting hologram as described below. In this manner, the encoded set of data is written to the sub-volume 110. In the examples below, the set of data is encoded as a digital image, which is then embedded in the input beam 104 via spatial modulation.

As shown in FIG. 1B, in order to read the data from the sub-volume 110, a matching reference beam 116 is directed into the sub-volume 110, via the second side surface 102-6 of the medium 102, where it interacts with the hologram to create an output beam 108 that will essentially match the input beam 104 used to write the hologram, to the extent that the embedded data is recoverable from the output beam 110. The output beam 108 propagates out of the sub-volume 110, via a third side surface 102-8 of the medium 102.

The reference beam 116 used to read the data substantially matches the reference beam 106 originally used to write the data, and in particular is directed at an angle (or, more generally, direction) that closely matches that of the original reference beam 106. This is because the ability to read the hologram (i.e. produce an output beam 108 from which the data can be recovered) is highly sensitive to angular deviation between the reference beams 106, 116 used to write and read the hologram respectively. It is this sensitivity that can be exploited to record multiple holograms within the same sub-volume 110—each hologram is created using a different reference beam angle, and two distinct holograms may be created with only a slight difference in reference beam angle. In this manner, a large number (e.g. hundreds or thousands) of holograms can be written to the same sub-volume 110, each encoding a large number (e.g. millions) of bits.

FIG. 2A shows a schematic perspective view of an example holographic storage system 200 which incorporates certain principles of the present disclosure. In this particular example, three separate waveguides 204, 206 and 208 are used to carry the input beam 104, the reference beams 116, 126 and the output beam 118, and may be individually referred to as the input waveguide 204, the reference waveguide 206 and the output waveguide 208. As noted, the terms "optical waveguide" and "light pipe" are used interchangeably herein. Each of the waveguides 204, 206 and 208 provides spatial multiplexing in the sense that it can guide a signal to (in the case of the input and reference waveguides 204, 206) or from (in the case of output waveguide 208) any one of multiple sub-volumes within the holographic recording medium 102. This provides spatial multiplexing across the volume of the holographic recording medium 102 without requiring any mechanical movement of any of the waveguides 204, 206, 208 relative to the holographic recording medium 102. In order to avoid the need for such mechanical movement, guiding elements are located on or within each of the waveguides 204, 206, 208 and are configurable to change the optical properties of the waveguides 204, 206, 208 so as to guide signals to or from different sub-volumes of the medium 102. That is, to create different channels within the waveguides 204, 206, 208 as needed. In this particular example, the guiding elements take the form of active optical switching elements (switches). There are various forms the switches can take. In this example, the switches take the form of SBGs located in different surface regions of the waveguides 204, 206, 208, in the same general arrangement as FIGS. 3A-E. That is, the waveguides 204, 206 and 208 each take the form of active light pipes, and each of the waveguides 204, 206, 208 has the same general physical structure as the active light pipe 300 of FIGS. 3A-E.

Each waveguide 204, 206, 208 is arranged with its first surface (i.e. the surface on which its SBGs are located) adjacent a different side surface of the medium 102, such that its SBGs extend along that side surface of the medium 102. First and second SBGs of each waveguide 204, 206, 208 are denoted by reference numerals 204-1, 204-2; 206-1, 206-2; and 208-1, 208-2 respectively, all of which are configurable in the manner described above. Further SBGs are depicted without reference numerals, and the number of SBGs can be chosen to accommodate any size of holographic recording medium 102. The following description refers to the first and second SBGs of each waveguide 204, 206, 208 for conciseness but it will be appreciated that the description applies to a greater number of SBGs.

FIGS. 2B to 2D show how the input and reference waveguides 204, 206 are used to write data to the medium 102 in a one-to-many fashion. FIG. 2B shows a schematic plan view of the system 200 and FIGS. 2C and 2D show alternate side views, in which the input and reference waveguides 204, 206 are visible respectively. The input waveguide 404 is used to guide the input beam 104 to any one of multiple sub-volumes of the medium 102 via any one of the SBGs 404-1, 404-2 of the input waveguide 204 in the manner described above. The reference waveguide 406 is configured to guide the reference beam 106 to the same sub-volume simultaneously in order to create the desired interference pattern to be written to that sub-volume. In the depicted examples, both the input and reference waveguides 204, 206 are currently configured to guide the input and reference beams 104, 106 to the sub-volume denoted by reference numeral 110, via the second SBGs 204-2, 206-2 of each waveguide 204, 206.

FIGS. 2E to 2G show how the reference and output waveguides 206, 208 may be used to read data from the medium 102. FIG. 2E is a plan view and FIGS. 2F and 2G show alternate side views in which the reference and output waveguides 204, 206 are visible. The reference waveguide 206 is used in exactly the same way as depicted in FIGS. 2B to 2D, but now to guide the reference beam 116 to any sub-volume from which a hologram is to be read—the sub-volume 110 in this case. The output waveguide 208 is used in a one-to-many fashion to guide the resulting output beam 108 from the sub-volume 110 and through the through waveguide 208 for subsequent detection.

Each sub-volume 110 could for example have a height and width of a few millimetres as measured along any of the side surfaces, and this would generally be sufficient to store several million pixels per data "page" (e.g. multiplexing angle)—in which case, the sub-volume volume is sufficient to store (millions of pixels)*(# multiplexing angles).

The guiding elements of the input waveguide 204 and reference waveguide 206 (the SBGs in this example) are configured as needed to provide channels for the input beam 104 and reference beams 106, 116 from a beam source (emission system) to the sub-volume 108 to be read to. With SBGs, this is a case of setting the SBGs to transmissive or reflective states as needed to create the channel. Similarly, the guiding elements of the output waveguide 208 (also SBGs in this example) are similarly set to provide a channel from the sub-volume 108 being read from to a detector. In order to provide additional context, this is described in more detail below with reference to a multi-waveguide network depicted in FIG. 5. However, the principles described in relation to the specific example FIG. 5 apply more generally to other waveguide network topologies, both simpler networks (e.g. a single waveguide) or more complex waveguide networks.

As set out above, this allows spatial multiplexing over the medium 102, without any mechanical movement of the medium 102 relative to the waveguides 204, 206, 208. This is true whatever form the guiding elements take (the guiding elements themselves could be mechanical or non-mechanical, as noted above).

Holographic Storage Using Multi-Waveguide Networks

Figure 5:
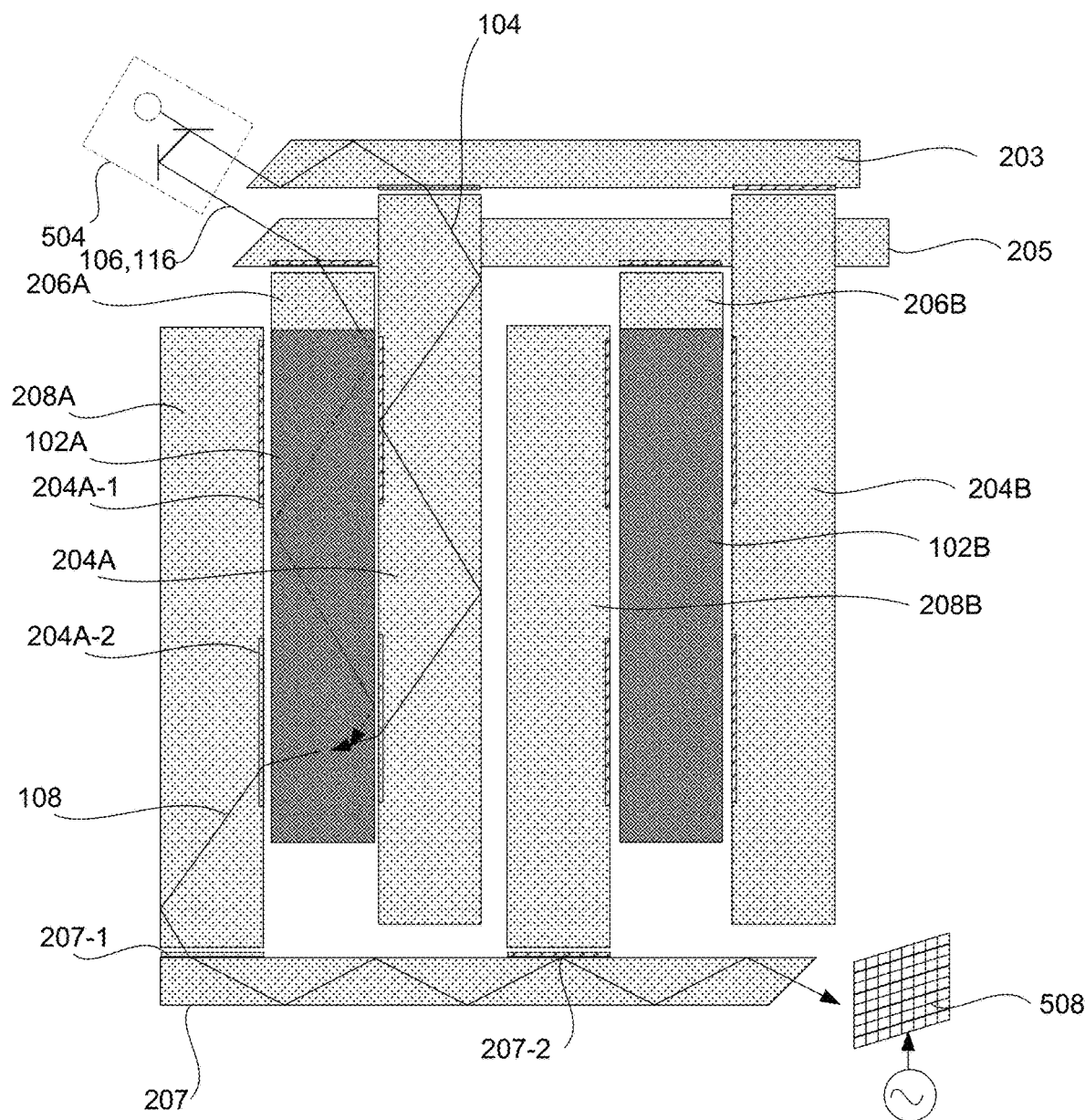
FIG. 5 shows a schematic view of an example of multi-waveguide network used for multiplexing over multiple pieces of holographic storage media.

FIG. 5 shows an example of a holographic storage system incorporating multi-waveguide networks of the kind shown in FIG. 4.

An input waveguide network is shown to comprise a first input light pipe 203 (a "parent" waveguide) to which multiple second input light pipes 204A, 204B ("child" waveguides) are coupled. An input beam 104 from an emitter system 504 is coupled into the first input waveguide 203 via an in-coupling region thereof, and can be guided from there into any of the second input waveguides 204A, 204B.

A reference waveguide network is shown to comprise a first reference waveguide 205 to which multiple second reference waveguides 206A, 206B are coupled. A reference beam 106, 116 from the emitter system 504 is similarly coupled into the first reference waveguide 205, and can be guided to any of the second reference waveguides 206A, 206B.

An output waveguide network is shown to comprise a first output waveguide 207 to which multiple second output waveguides 208A, 208B are coupled.

The depicted arrangement allows beams to be directed to/from different sub-volumes of multiple pieces of holographic storage media 102A, 102B.

Although FIG. 4 shows an input beam 104, reference beams 106, 116 and the output beam 108, it will be appreciated that a sub-volume would typically be written to and read from at different times, in the manner described above with reference to FIGS. 2A-G.

A first group of the second waveguides 204A, 204B, 204C (one each of input, reference and output) are located around the first piece of holographic storage media 102A (first medium), and a second group of the second waveguides 204B, 206B, 208B are located around the second piece 102B (second medium), each in the same general arrangement as FIGS. 2A-G. Hence, input and reference beams 104, 106, 116 can be directed to any-sub volume of any piece of media 102A, 102B by first guiding those beams to the desired second waveguide of the input and reference networks respectively, and then to the desired sub-volume of the piece of media adjacent the desired waveguide.

The output waveguide network can be used to guide an output beam 108 from any sub-volume of any piece of media 102A, 102B from the applicable second output waveguide 208A, 208B into the first output waveguide 207, and from there to a detector via an out-coupling region of the first output waveguide 207 a detector 508. In order to read from a specific sub-volume, the SBGs are configured to provide a channel from that sub-volume to the detector; so, in this case, SBGs 204A-2 and 207A-1 are set to transmissive states and other SBG(s) of the output waveguide network are set to reflective states as needed to provide a channel for the output beam 108 to the detector 508 (e.g. in this case, SBG 207-2 of the first output waveguide 207 is set to reflective to prevent propagation of the output beam 104 into waveguide 207-2). Other SBGs of the output waveguide network can be set to reflective to the extent needed to prevent transmission of any unwanted light, i.e. "leakage" from other regions of the same piece of media 102A or from different piece(s) of media 102B (e.g., in this example, SBG 204A-1 near to the sub-volume being read from is shown set to reflective to prevent unwanted leakage).

Whilst in the above examples, three separate waveguide networks are used for the input, reference and output beams 104, 106, 116, 108, this is not necessarily required. For example, the same waveguide network could be used to carry both the input beam 104 and the reference beams 106, 116 and/or the same waveguide network could be used to carry the input beam 104 and the output beam 108 and/or the same waveguide network could be used to carry the output beam 108 and the input beam 104. It is generally expected that having three separate networks will provide optimal performance, but there are nevertheless perfectly viable implementations using one or two waveguide networks only.

Although not depicted in any of the figures, a fourth waveguide network could be used to carry beams to the remaining side surfaces of the pieces of media 108A, 108B. For example, a fourth network could be used to carry an erase beam to a desired sub-volume, suitable for erasing at least hologram therefrom (in the case of erasable holographic storage).

Figure 9:
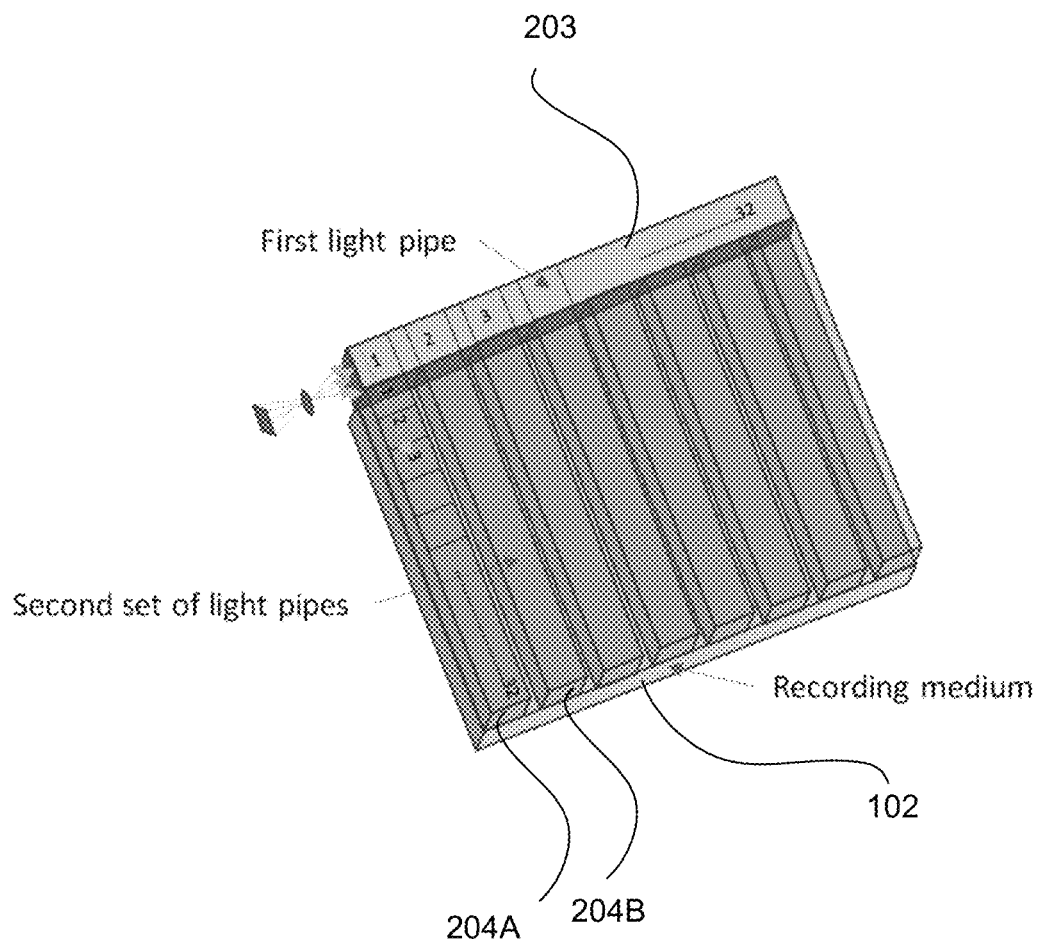
FIG. 9 shows an alternative holographic storage system, in which at least one waveguide network is used to spatially multiplex over a slab of holographic recording media in two dimensions.

FIG. 9 shows an alternative physical structure, where a single "slab" of holographic media 102 is used in place of the individual pieces 102A, 102B of FIG. 5. An input waveguide network is depicted, and has the essentially the same physical configuration, but with the second input waveguides 204A, 204B now configured to guide an input beam 104 to different sub-volumes of the same slab 102. Whereas in FIG. 5, each second input waveguide 204A, 204B provides multiplexing in a single dimension, along the length of a different single piece of media 102A, 102B, in FIG. 9, the second waveguides 204A, 204B provide spatial multiplexing in two dimensions over the slab of holographic medium 102 (each waveguide individually provides one-dimensional multiplexing, but there is 2D multiplexing over the slab 102 as a whole).

The system of FIG. 9 is limited to a maximum of two waveguide networks (one on each side of the slab 102). As noted above, this is nonetheless a viable arrangement because it is possible to use the same network to carry multiple beams.

Data Encoding

Figure 6A:
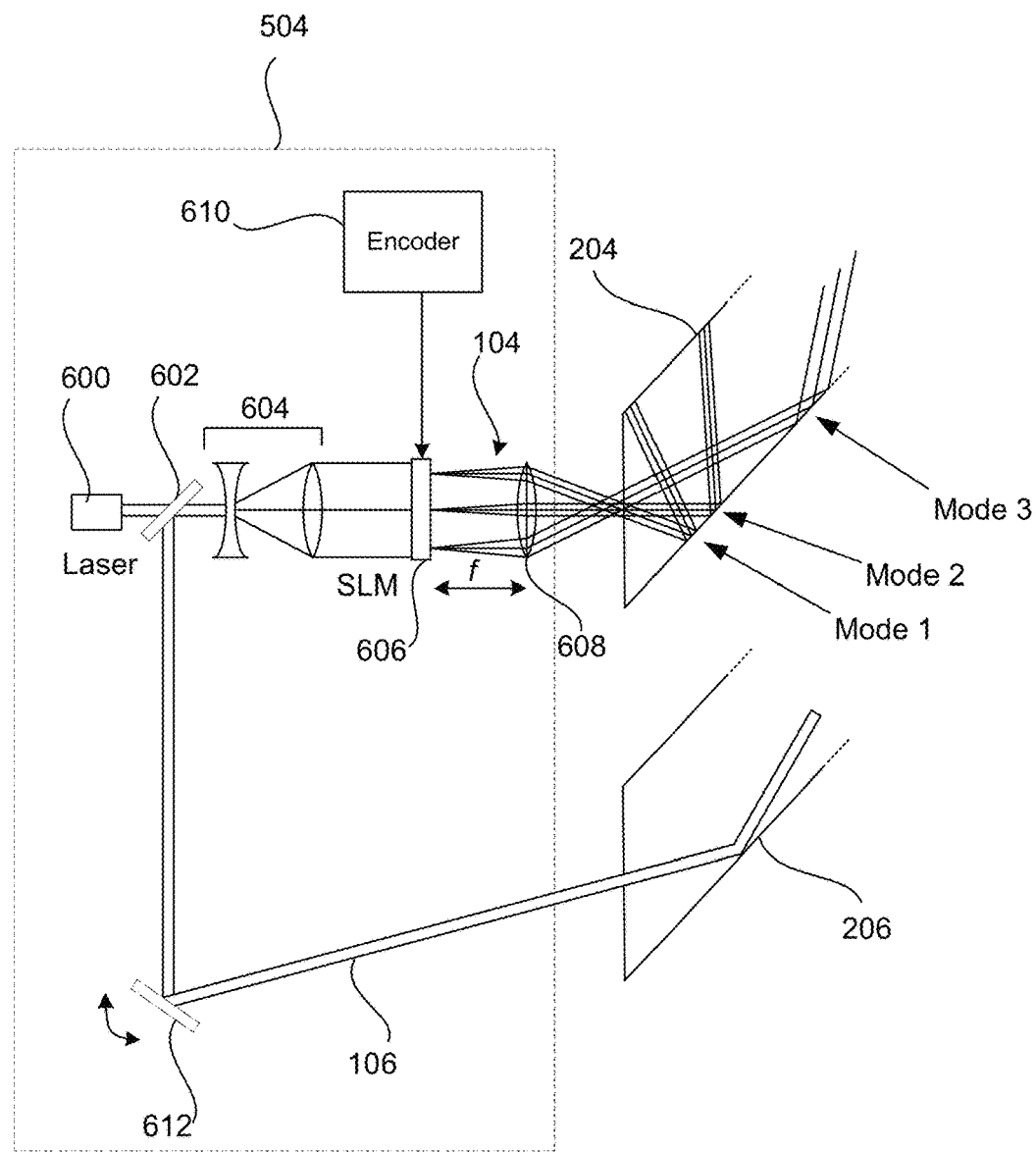
FIG. 6A shows an example of an emission system for providing input and reference beams in a holographic storage system.

FIG. 6A shows an example of an emitter system 504 which provides both an input beam 104 and a reference beam 106. The input beam is an expanded, spatially modulated laser beam. A laser 600 emits a coherent, narrow laser beam, which is split using a beam splitter 604.

One part of the beam from the beam splitter 602 is used as the reference beam 106. In this example, a controllable reference beam steering element 612 is used to steer the reference beam 106 into a reference waveguide 106 at a desired angle. By changing the angle of the reference beam 106 before it is coupled into the reference waveguide 206, different holograms can be written to/read from the same sub-volume of media in the manner described above.

Alternatively to in addition to beam angle multiplexing, multiple patterns may be stored to and read from the same sub-volume with different phases of the reference beam 106, 116 (phase multiplexing). Thus, a logical address may correspond to a particular reference beam angle and/or phase characteristic. All description pertaining to the modulation of reference beam angle applies equally to phase modulation.

The other part of the beam from the beam splitter 602 is expanded using a beam expander 604 and the expanded beam passes through a spatial light modulator (SLM) 606. An encoder 610 receives a set of data to be encoded and encodes it as a digital image that is then modulated into the expanded beam via the SLM 606. In-coupling optics—in this case, a Fourier lens 608 located such that the plane of the SLM 606 lies substantially in the focal plane of the Fourier lens 608—is used to separate the expanded beam into distinct modes of propagation; a mode corresponding to a unique direction of propagation in this example, with each mode now corresponding to a particular point in the plane of the SLM 606. The different propagation modes are coupled into an input waveguide 202, through which they are guided in the manner described above. With the in-coupling optics 608, data is "angularly encoded" within the reference beam, in the sense that points within the digital image essentially correspond to unique directions of propagation, i.e. unique propagation modes of the input beam 104. This is analogous to the rays from a distant object taken to be at infinity. The angularly encoded input beam 104 of FIG. 6A is one example of a "multimode" optical signal multiple propagation modes (i.e. components propagating in different directions) and this arrangement provides a form of angular diversity.

Figure 6B:
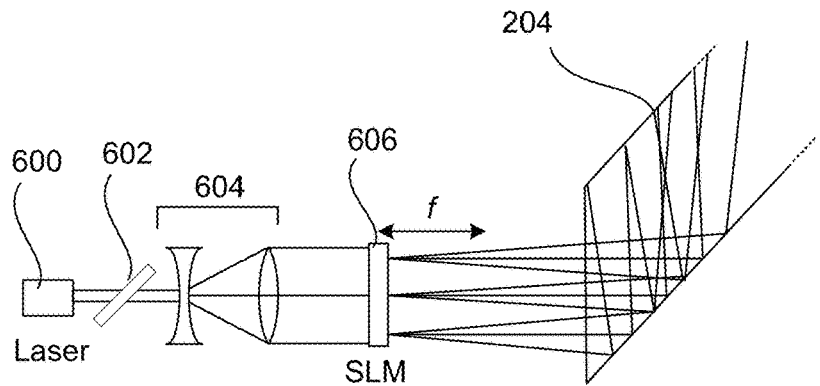
FIG. 6B shows a variation of the emission system with simplified optics.

Note the term "multimode" does not necessarily imply the use of such in-coupling optics 608, nor does it require that every image point uniquely corresponds to a given direction of propagation. That is, multimode does not necessarily imply a one-to-one correspondence between propagation modes and image points/data points. For example, FIG. 6B shows an alternative viable emitter system in which the spatially modulated beam is coupled directly into the input waveguide 204. In this case, there are still multiple modes (i.e. multiple spatial paths through the waveguide for any given channel), but without the one-to-one correspondence between directions of propagation and image points, and possibly without any one-to-one correspondence between image/data points and modes. This provides a form of spatial diversity based on a form of MIMO (multiple input multiple output) transfer, via the multiple pixels of the SLM 606 and the detector array of the spatially coherent detector 508.

Data Decoding

Figure 7:
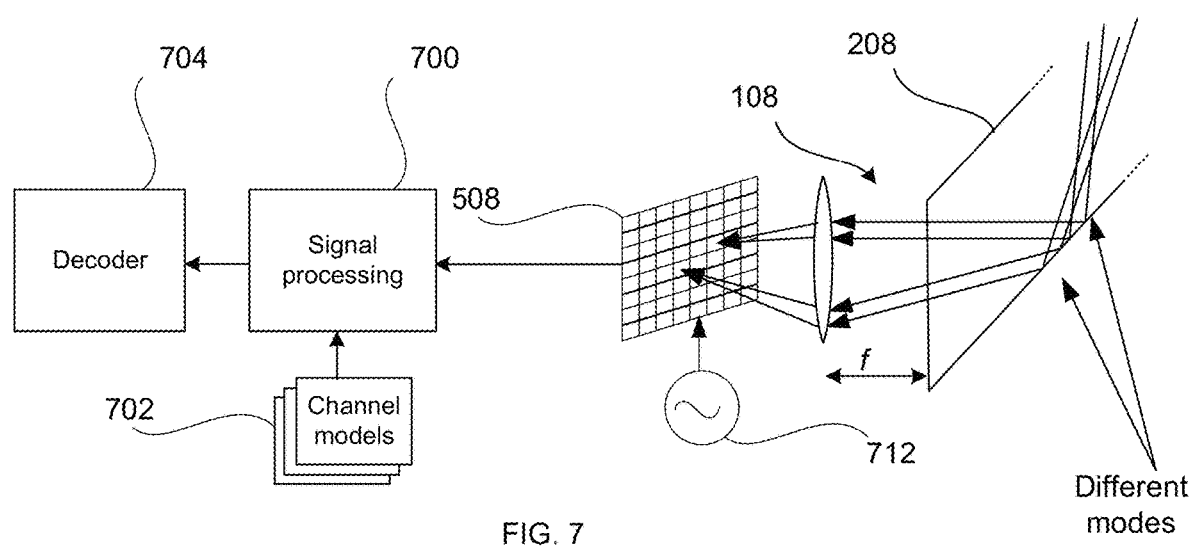
FIG. 7 shows an example of a data retrieval system that uses spatial coherent detection to measure the optical field of an output beam and signal processing to mitigate waveguide distortion in the measured optical field.

FIG. 7 shows a spatial coherent detector 508 used for measuring the optical field of the output beam 108. In contrast to conventional "direct detection", the spatial coherent detector 508 comprises an array of pixels (or, more generally, detector elements) each of which is configured to measure both an amplitude and a phase of an optical field at a location of that pixel (and not simply the intensity). These may be measured e.g. using a local oscillator 712 of the spatial coherent detector 508. The array of pixels is thus able to measure variations in the phase and amplitude of the optical field in both time and space, and thus provide an analogue or digital representation of the measured optical field. In this case, the measured optical field is an optical field of an output beam 108 guided to the spatial coherent detector 208 via an output waveguide 208.

Although only a single array is depicted, there could in fact be multiple physical arrays that cooperate as a single "logical array". For example, this logical array may be split over two physical cameras.

A physical detector array could take the form of a single camera (with each detector element being a pixel or a set of pixels of the camera), or multiple cameras. In the extreme case, each detector element could be a separate camera, and in that case the logical detector array may potentially be split over very many physical detectors.

As noted, a route from a specific in-coupling region at which a beam enters a waveguide network to a specific outcoupling region at which it exits the waveguide network (where those regions could be in the same or different waveguides) may be referred to herein as a "channel". As noted, in a multimode waveguide network, a single channel will encompass multiple spatial paths. The output beam 108 will have been guided via a specific channel of an output waveguide network, i.e. from a specific in-coupling region thereof to the out-coupling region of the output waveguide 208. Moreover, it will have been generated from a hologram that was created using an input beam guided from the in-coupling region of an input waveguide network to a specific out-coupling region thereof. The hologram will have been created and read using reference beams similarly guided via specific channels through a reference waveguide network. The input beam 104, reference beams 106, 116 and output beam 108 are all susceptible to distortion within the relevant waveguide network that is specific to the channels via which they have been guided. A signal processing component 700 applies analogue and/or digital signal processing to the representation of the measured field in order to compensate for such distortion; it does so using a channel model associated with the sub-volume currently being read from (i.e. from which the output beam 108 was produced). The channel model associated with a particular sub-volume will model not only the channel via which the output beam 108 has been guided to the detector 508, but also the channels via which the input beam 104 used to write the hologram was guided to that sub-volume, and the channel via which the reference beams 106, 116 used to write to/read the hologram were guided to that sub-volume.

Each channel model could for example take the form of a transfer function (directly modelling the channel) or an inverse transfer function (modelling the channel in terms of its approximate inverse). Note that the transfer function is applied to the representation of the measured optical field, i.e. both its measured phase and amplitude at different spatial points, and not simply the intensity of the light. Spatial coherent detection provides greater scope for removing or reducing such channel distortion, the aim being to recover the original digital image sufficiently accurately to facilitate decoding of the encoded data from the recovered image by a decoder 704.

The signal processing 700 could, for example, correct for phase interference and noise using a combination of optical and computation techniques, which may, for example, include machine learning techniques.

Although described in the context of holographic storage, the use of such signal processing 700 in combination with spatial coherent detection is not limited in this respect, and can be applied in other contexts such as optical communication or optical computation, or any other context in which a received output beam is susceptible to distortion introduced in one or more waveguide networks.

FIG. 7 shows out-coupling optics 715 arranged to essentially reverse the effect of the in-coupling optics 608 of FIG. 6B, i.e. to resolve each propagation mode to essentially a single point within the plane of the spatial coherent detector 508. Again, this is not essential, and with the alternative emission system of FIG. 6B, the out-coupling optics 715 could be omitted.

Although not depicted in FIG. 6A or 6B, some level of pre-processing may be applied to the digital image before it is modulated into the input beam 104. This may reduce the level of compensation needed at the detector side. Even with such pre-processing, some amount of detector side processing may be applied, to account different distortion effects between different channels.

Dynamic Scheduling

Figure 8:
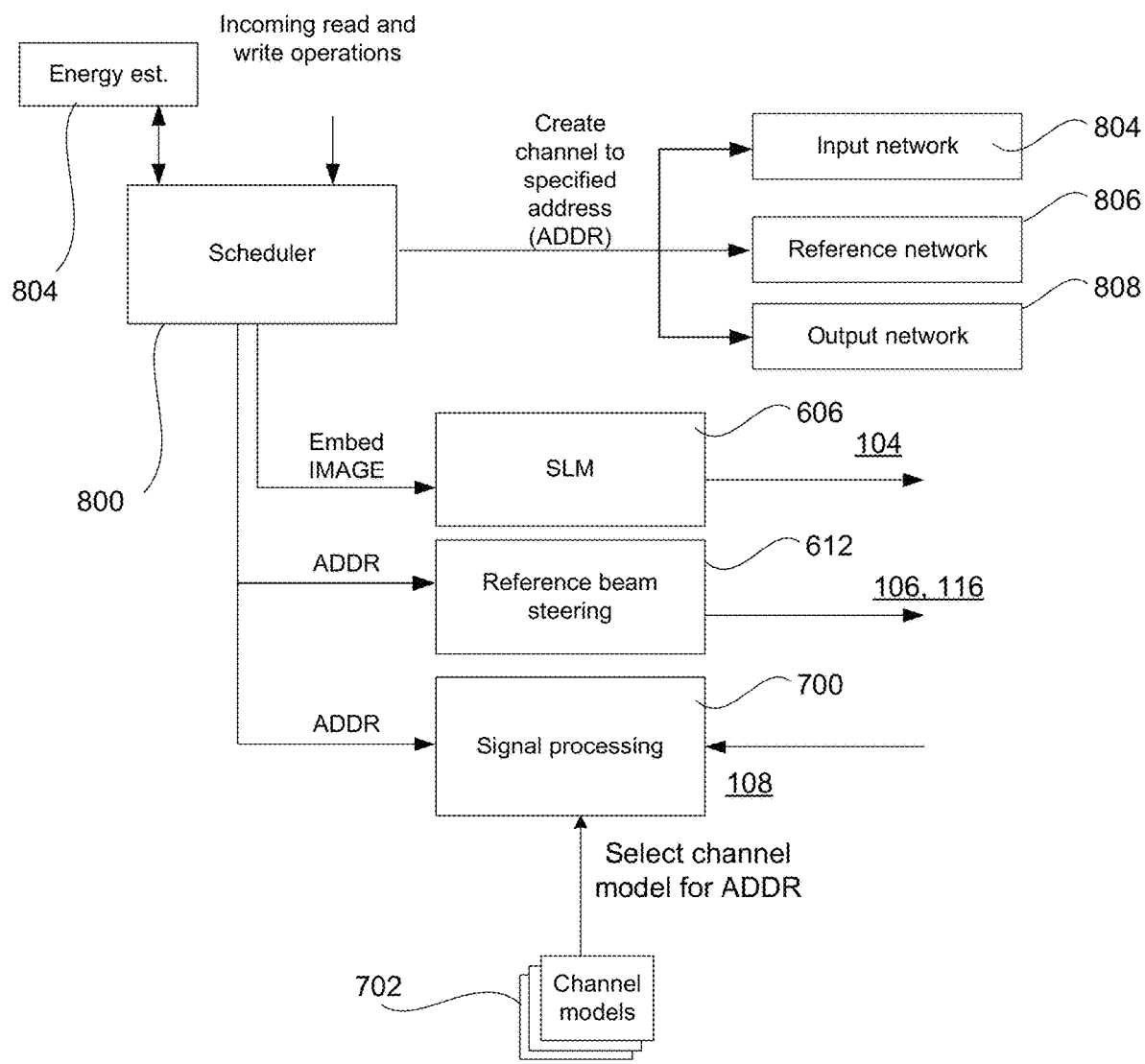
FIG. 8 shows a function block diagram denoting functions performed within a holographic storage system.

FIG. 8 shows a controller, in the form of scheduler 800 which can schedule read and write operations within a holographic storage system of the kind described above. To facilitate effective scheduling, sub-volumes within the media 108, or within each piece of media 108A, 108B, are assigned unique addresses. This provides a form of addressable holographic storage, analogous to more conventional forms of addressable electronic storage. However, there are a number of distinctions over conventional addressing.

Firstly, as described above, a single sub-volume can store multiple holograms at different reference beam angles. To accommodate this, each address uniquely corresponds to a specific sub-volume in combination with a specific reference beam direction, i.e. each available tuple is assigned a unique address, where denoted a specific sub-volume within the medium 102 or one of the pieces of media 102A, 102B and denotes a particular reference beam direction (e.g. an angle or set of multiple angles defining the beam direction; the term "angle" may be used as shorthand to refer to the direction of the reference beam, though it will be appreciated that the direction may in fact be defined by multiple angles depending on the configuration of the system). Hence, a sub-volume may be associated with a potentially large number of addresses, corresponding to different reference beam angles. The tuple defines a logical storage location where multiple logical storage locations are provided, at the physical level, by the same sub-volume at different reference beam angles. Each logical storage location has a unique address (ADDR). The notation is used as shorthand to mean address corresponding to sub-volume and reference beam angle, though it will be appreciated that this does not imply any particular representation of the address. Any address space and addressing mechanism that uniquely identifies logical storage locations of this nature can be used.

Secondly, in contrast to conventional storage, each logical storage location can store an entire image, and hence a single logical storage location can potentially store a very large number (e.g. thousands or millions) of bits.

The scheduler 800 operates at the logical storage level and schedules income read and write operations pertaining to different addresses within appropriate time intervals.

Reference numerals 804, 806 and 808 are used to denote input, reference and output optical waveguide networks respectively. As noted above, each be a single-waveguide network or multi-waveguide network (e.g. as in FIG. 5), with one or more configurable guiding elements (e.g. SBGs or other active switching elements) which can be used to create channels to different sub-volumes of a piece (or pieces) of holographic storage media.

During an interval in which a write operation pertaining to a particular address is scheduled (write interval), the guiding elements within the input and reference waveguide networks 804, 806 are set to create a channel for the input beam 104 and reference beam 106 from the emitter system 504 through the input and reference networks 804, 806 respectively to the corresponding sub-volume; additionally, the reference beam steering element 612 is set to direct the reference beam 106 into the reference network 806 in the corresponding direction. This causes the desired interference pattern to be created within sub-volume at reference beam angle, which in turn causes that interference pattern to be persistently stored as a hologram provided the sub-volume is exposed to the interference pattern for a sufficiently long duration.

During an interval in which a read operation pertaining to a particular address is scheduled (write interval), the guiding elements within the reference and output networks 806, 808 are similarly set to create a channel for the reference beam 116 through the reference network 806 to the sub-volume and to create channel for the output beam 108 through the output network 808 from the sub-volume to the detector 508; the reference beam steering element 612 is similarly set to direct the reference beam 116 into the reference network 806 in the corresponding direction, in order to read the intended hologram at sub-volume and reference beam angle.

Figure 10A:
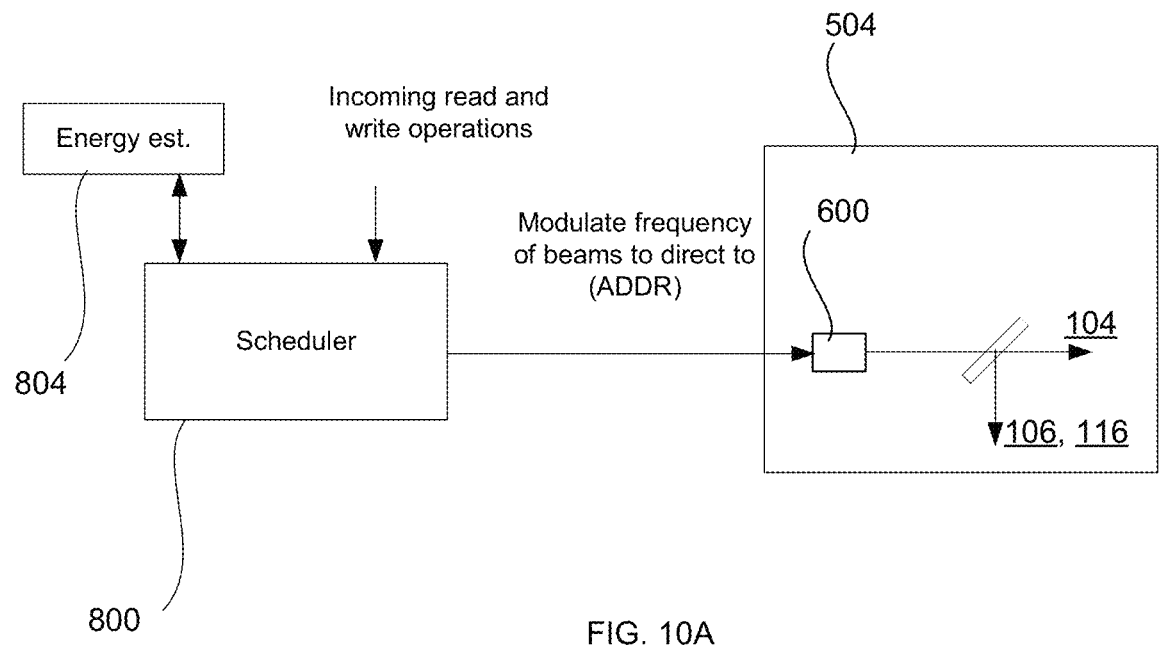
FIGS. 10A and 10B show how spatial multiplexing may be achieved with passive guiding elements, where spatial multiplexing is achieved by modulating beam characteristic(s)
Figure 10B:
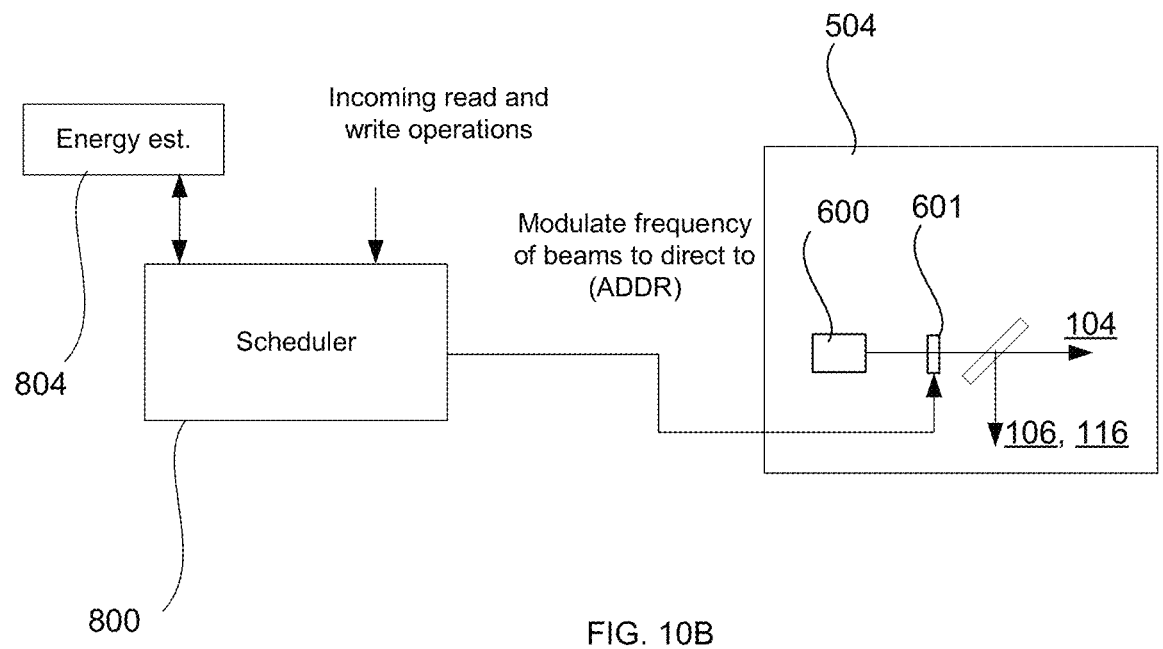

Alternative Waveguide Network:

FIGS. 10A and 10B shows alternative systems, in which spatial multiplexing is instead achieved by modulating one or more optical characteristics of the input and reference beams 104, 106, 116. In such a system, passive (non-switchable) guiding elements may be used in place of the active (switchable) guiding elements of the earlier figures.

The example of FIG. 10A considers frequency (or, equivalently, wavelength) modulation. In this case, the light pipe(s) itself (themselves) could be passive, with static wavelength-dependent outcoupling (such as successively longer-pass dichroic interference filters, or varying centre wavelength bandpass filters).

FIG. 11A shows a light pipe 1100 having an outer surface 1100-S, along which multiple passive filters 1100-1, 1100-2 lie. The configuration of the light pipe 1100 is the same as that of FIGS. 3A-D, aside form the fact that the filters 1100-1, 1100-2 replace the SBGs 300-1, 300-2. The filters 1100-1, 1100-2 have different frequency responses (i.e. they act as frequency filters). More specifically, each filter 1100-1, 1100-2 is essentially transmissive to a relatively narrow range of optical frequencies, and essentially reflective to frequencies outside of that range. FIG. 11A shows an in-coupled beam 1104 with a frequency within the range of the second filter 1100-2, but outside the range of the first filter 1100-1. Hence, the beam 1104 is reflected from the former, but transmitted through the latter (thus exiting the light pipe 1100 at that location). FIG. 11B shows a beam 1104' of different frequency, now within the range of the first filter 1100-1, which is thus transmitted through the first filter 1100-1.

Such a light pipe 1100 can be used in place of the active light pipes described above, and the above description applies equally with the following modification to the system.

FIG. 10A shows the scheduler 800 communicatively coupled to the laser 600 of the emitter system for varying the frequency (or, equivalently, wavelength) of the input and reference beams 104, 106, 116. In this case, either beam can be directed to a desired holographic storage region by setting the frequency accordingly. Different beam frequencies now correspond to different routes through the waveguide networks (defined by the different frequency characteristics of the passive filters), and the frequency can be set to correspond to any desired route.

In this case, wavelength is used as the switching dimension. The laser 600 is a fast tuneable laser that functions as an active element.

In such a realisation, switching could be in one spatial dimension only (i.e. along a single pipe). However, with a laser with sufficient range and line narrowness, a first light pipe could filter coarsely (i.e. over relatively wider wavelength ranges) and subsequent light pipes sample more finely (i.e. over narrower wavelength ranges). Another factor that restricts line with is the desire for a relatively long coherence length, so the line may be sufficiently narrow in any event. To achieve replication of the input field to addressable locations across a 2D output space in a holographic storage context, this implementation could, for example, be combined with a second implementation using a different switchable parameter (e.g. polarisation).

In the context of a read operation, the frequency of the output beam 108 will match that of the reference beam 116 used to read a particular sub-volume, and can be guided back to the detector using suitable filters in the output waveguide network 808, applying the same principles.

FIG. 10B shows an example of such an implementation with a controllable polarization element 601, which can be used to vary the polarization of the input and reference beams 104, 106, 116. This could be combined with passive polarization filters on or within the light pipes. This could be implemented as an alternative or in addition to the passive frequency filters in the example of FIG. 10A. Such polarization modulation would provide two independent routes, and can be usefully combined e.g. with passive wavelength filtering and/or active light pipe(s). Polarization modulation of the beam could also be combined with active polarization filter(s).

Note, all of the various "passive" and "active" implementations described above can be implemented separately or in combination, e.g. a combination of active and passive guiding elements could be used. That is, a waveguide could have both passive and active elements and/or active and passive waveguides could be combined in the same network.

Additional Hierarchical Levels:

The above examples consider waveguide networks with two hierarchical "levels" of parent and child waveguides. However, a multi-waveguide network could have three levels (parent, child, grandchild) or more. Note the terms "child", "parent" and "grandparent" do not necessarily imply direct hierarchical relationships, i.e. the term child or grandchild could refer to any waveguide at any hierarchical level below a parent or child waveguide respectively; that is, a child/grandchild waveguide could be optically coupled to a parent/child waveguide not only via e.g. an air interface (direct descendant) but also via one or more other child/grandchild waveguides thereof (indirect descendent).

Figure 12:
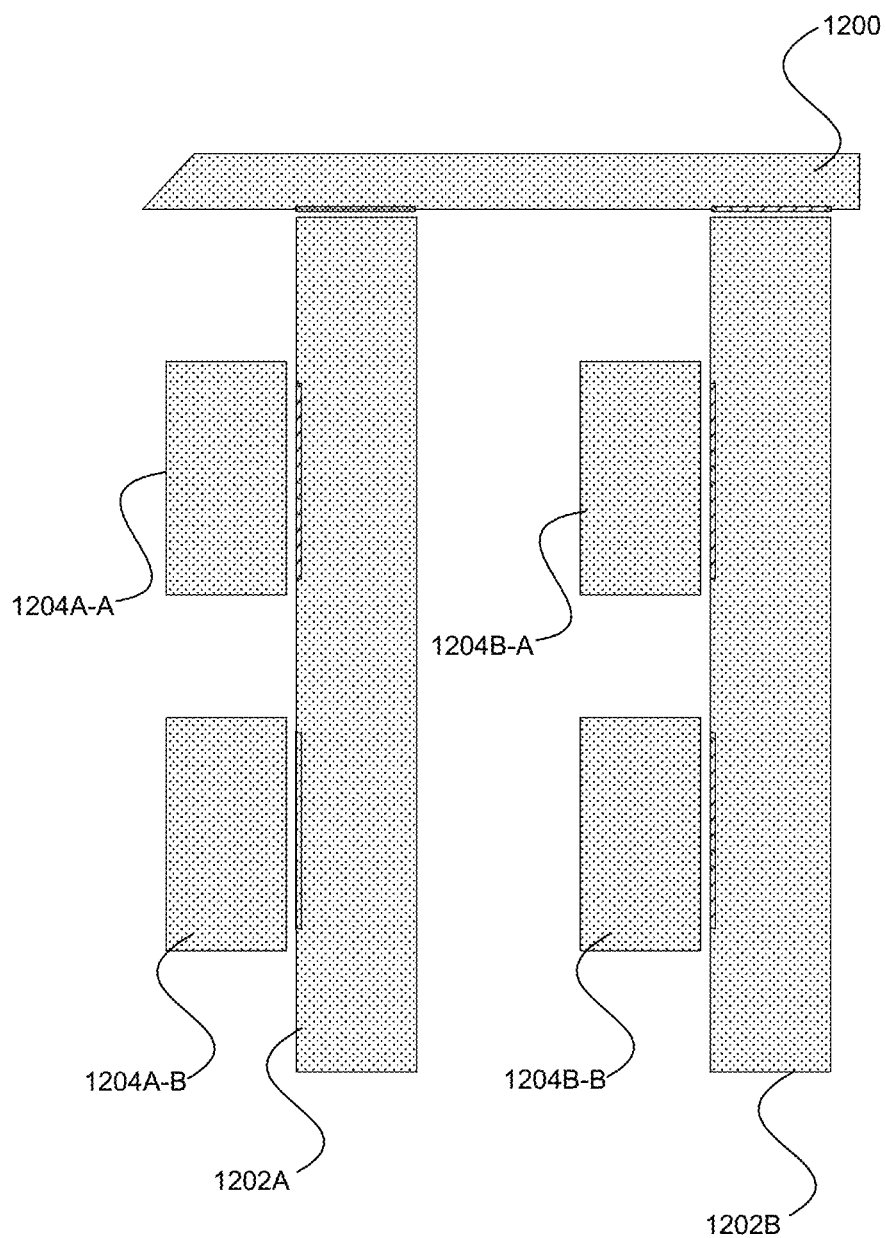
FIG. 12 shows an example of a waveguide network with three hierarchical levels.

FIG. 12 shows an example of a waveguide network with three hierarchical levels. A parent waveguide 1200 has two direct child waveguide networks 1202A, 1202B optically coupled thereto in the above manner, and each of those child waveguides 1202A/1202B has two grandchild networks 1204A-A, 1204A-B/1204B-A, 1204B-B optically coupled thereto in same way.

An extreme example would be a "binary tree" architecture, where every waveguide has exactly two direct children, with a potentially more than three levels of waveguide. However, in practice, there may also be circumstances where it is preferable to increase the number of direct children to reduce the required number of hierarchical levels.

The scheduler 800 shown in FIGS. 8, 10A and 10B is a functional component of the system. Similarly, the encoder 610, decoder 704 and signal processing component 700 are functional components. Such components can be implemented in software (i.e. as program code executed on one or more programmable hardware processors, such as CPUs, accelerators, e.g. GPUs etc.), or using other forms of processor hardware such as Field Programmable Gate Array(s) and/or Application Specific Integrated Circuit(s). The signal processing performed by the signal processing component 700 can be analogue or digital signal processing, or any combination thereof. Such program code and other data (e.g. the channel models 702) may be encoded in computer readable storage. Examples of computer readable storage include optical, magnetic and/or solid-state storage, in which code, data and the like may be stored in non-transitory form. This contrasts with a transitory media such as a transient signal carrier.

A first aspect herein provides a multimode optical waveguide network comprising: a parent waveguide; and a plurality of child waveguides; wherein each of the parent and child waveguides is a multimode optical waveguide having a first surface region, multiple second surface regions, and at least one guiding element attached to a surface of the waveguide or embedded within the waveguide, each of the second surface regions of the parent waveguide being optically coupled to the first surface region of a corresponding one of the child waveguides; and wherein the at least one guiding element of the parent waveguide is arranged to guide a beam, from or to its first surface region, to or from any selected second surface region of its multiple second surface regions, the beam being coupled into or received from the corresponding child waveguide whose first surface region is optically coupled to that second surface region of the parent waveguide, via that second surface region of the parent waveguide and that first surface region of the corresponding child waveguide, the at least one guiding element of each child waveguide arranged to guide a beam, from or to its first surface region, to or from any selected second surface region of its multiple second surface regions, wherein the at least one guiding element of each of the waveguides is configurable for selecting the second surface region of that waveguide and/or responsive to at least one beam characteristic for selecting the second surface region of that waveguide via modulation of the at least one beam characteristic.

In embodiments, the multimode optical waveguide network may comprise a plurality of grandchild waveguides, each of which is a multimode optical waveguide having a first surface region, multiple second surface regions, and at least one guiding element attached to a surface of the grandchild waveguide or embedded within the grandchild waveguide, each of the second surface regions of each of the child waveguides being optically coupled to the first surface region of a corresponding one of the grandchild waveguides; wherein the at least one guiding element of each grandchild waveguide may be arranged to guide a beam, from or to its first surface region, to or from any selected second surface region of its multiple second surface regions, the beam being coupled into or out of that grandchild waveguide via its first surface region and the second surface region of the child waveguide optically coupled thereto, the at least one guiding element of each of the grandchild waveguides being configurable for selecting the second surface region of that grandchild waveguide and/or responsive to at least one beam characteristic for selecting the second surface region of that grandchild waveguide via modulation of the at least one beam characteristic.

Each of the waveguides may have at least one active guiding element configurable for selecting the second surface region of that waveguide.

Each of the waveguides may have at least one guiding element responsive to at least one beam characteristic for selecting the second surface region of that waveguide via modulation of the at least one beam characteristic.

At least one of the waveguides may have at least one active guiding element configurable for selecting the second surface region of that waveguide, and at least another of the waveguides may have at least one guiding element responsive to at least one beam characteristic for selecting the second surface region of that other waveguide via modulation of the at least one beam characteristic.

One of the parent waveguide and one of the child waveguides may have at least one wavelength-responsive guiding element, such that a beam within a first wavelength range is guided, from or to its first surface region, into or from a first of the child or grandchild waveguides, and a beam within a second wavelength range is guided, from or to its first surface region, to or from a second of the child or grandchild waveguides; wherein the first child or grandchild waveguide may have at least one wavelength-responsive guiding element, such that a beam within a first sub-range of the first wavelength range is guided, from or to its first surface region, to or from one of its second surface regions, and a beam within a second sub-range of the first wavelength range is guided, from or to its first surface region, to or from another of its second surface regions; and wherein the second child or grandchild waveguide may have at least one wavelength-responsive guiding element, such that a beam within a first sub-range of the second wavelength range is guided, from or to its first surface region, to or from one of its second surface regions, and a beam within a second sub-range of the second wavelength range is guided, from or to its first surface region, to or from another of its second surface regions.

The or each active guiding element may have at least one of: a configurable transmissivity or reflectivity, or a configurable refractive index.

The or each active guiding element may be a switchable grating or grating region.

At least one of the guiding elements may be a wavelength and/or polarization filter having a fixed or configurable wavelength response and/or a fixed or configurable axis of polarization.

At least one of the waveguides may have two or more guiding elements and three or more second surface regions, any of which may be selected by configuring one or both of the two or more guiding elements and/or modulating at least one beam characteristic.

A second aspect herein provides an optical system comprising: a first optical system component; a plurality of second optical system components; at least one multimode optical waveguide network in accordance with any of the above aspects or embodiments, the multimode optical waveguide network arranged to guide a beam, from or to the first optical system component, to or from any selected second optical system component of the plurality of second optical system components; and a controller configured to select a second optical system component of the plurality of second optical system components, and cause a beam to be guided, from or to the first optical system component, to or from the selected second optical system component, by configuring at least one of the guiding elements of the multimode optical waveguide network and/or modulating at least one beam characteristic.

The first system component may comprise: an emitter system from which a beam is emitted and guided to the selected second system component, or a detector array to which a beam is guided from the selected second system component.

The optical system may comprise one or more holographic recording media, wherein at least some of the second system optical components may be respective sub-volumes of the one or more holographic recording media.

The optical system may comprise a second multimode optical waveguide network in accordance with any of the above aspect or embodiments, and the controller may be configured to cause a second beam to be guided, from or to the first optical system component, to or from the same selected second optical system component, by configuring at least one of the guiding elements of the second multimode optical waveguide network and/or modulating at least one beam characteristic.

The optical system may comprise a third multimode optical waveguide network in accordance with any of the above aspects or embodiments, and the controller may be configured to cause a third beam to be guided, from or to the first optical system component, to or from the same selected second optical system component, by configuring at least one of the guiding elements of the third multimode optical waveguide network and/or modulating at least one beam characteristic.

In e.g. an optical communication or optical computation context, at least one optical system component of the first and/or the second optical system components may comprise: a signal converter configured to convert a beam to an electrical signal or vice versa, or an optical processor.

It will be appreciated that the above embodiments have been described by way of example only. Other variants or use cases of the disclosed techniques may become apparent to the person skilled in the art once given the disclosure herein. The scope of the disclosure is not limited by the described embodiments but only by the accompanying claims.

The invention claimed is:

1. A multimode optical waveguide network comprising:
   a parent waveguide; and
   first and second child waveguides;
   wherein each of the parent waveguide and the first and second child waveguides is a multimode optical waveguide having a first surface region, at least two second surface regions, and at least one guiding element, wherein at least one of the second surface regions of the parent waveguide is optically coupled to the first surface region of the first child waveguide, and wherein at least one other of the second surface regions of the parent waveguide is optically coupled to the first surface region of the second child waveguide; and
   wherein the at least one guiding element of the parent waveguide is arranged to guide a beam, from or to the first surface region of the parent waveguide, to or from any selected second surface region of the at least two second surface regions of the parent waveguide, the beam being coupled into or received from the corresponding first or second child waveguide whose first surface region is optically coupled to the selected second surface region of the parent waveguide, via the selected second surface region of the parent waveguide and the first surface region of the corresponding first or second child waveguide, the at least one guiding element of each of the first and second child waveguides is arranged to guide a beam, from or to the first surface region of the respective first or second child waveguide, to or from any selected second surface region of the at least two second surface regions of the respective first or second child waveguide, wherein the at least one guiding element of each of the parent waveguide and the first and second child waveguides is configurable for switching guidance of the beam between the at least two second surface regions of that waveguide via at least one of changing an optical property of the at least one guiding element or modulation of at least one beam characteristic.

2. The multimode optical waveguide network of claim 1, comprising first and second grandchild waveguides, wherein each of the first and second grandchild waveguides is a multimode optical waveguide having a first surface region, at least two second surface regions, and at least one guiding element, wherein at least one of the second surface regions of the first child waveguide is optically coupled to the first surface region of the first grandchild waveguide, and wherein at least one of the second surface regions of the second child waveguide is optically coupled to the first surface region of the second grandchild waveguide; and wherein the at least one guiding element of each of the first and second grandchild waveguides is arranged to guide a beam, from or to the first surface region of the respective first or second grandchild waveguide, to or from any selected second surface region of the at least two second surface regions of the respective first or second grandchild waveguide, the beam being coupled into or out of the respective first or second grandchild waveguide via the first surface region of the respective first or second grandchild waveguide and the selected second surface region of the corresponding first or second child waveguide optically coupled thereto, the at least one guiding element of each of the first and second grandchild waveguides being configurable for switching guidance of the beam between the at least two second surface regions of that respective first or second grandchild waveguide via at least one of changing an optical property of the at least one guiding element or modulation of at least one beam characteristic.

3. The multimode optical waveguide network of claim 1, wherein at least one of the guiding elements comprises an active guiding element.

4. The multimode optical waveguide network of claim 3, wherein the active guiding element comprises at least one of: a configurable transmissivity or reflectivity, a configurable refractive index, a switchable grating, or a switchable grating region.

5. The multimode optical waveguide network of claim 1, wherein at least one of the guiding elements is responsive to the at least one beam characteristic.

6. The multimode optical waveguide network of claim 1, wherein the parent waveguide comprises at least one wavelength-responsive guiding element, such that a beam within a first wavelength range is guided, from or to the first surface region of the parent waveguide, into or from the first child waveguide, and a beam within a second wavelength range is guided, from or to the first surface region of the parent waveguide, to or from the second child waveguide;

wherein the first child waveguide has at least one wavelength responsive guiding element, such that a beam within a first sub-range of the first wavelength range is guided, from or to the first surface region of the first child waveguide, to or from one of the at least two second surface regions of the first child waveguide, and a beam within a second sub-range of the first wavelength range is guided, from or to the first surface region of the first child waveguide, to or from another of the at least two second surface regions of the first child waveguide; and wherein the second child waveguide has at least one wavelength-responsive guiding element, such that a beam within a first sub-range of the second wavelength range is guided, from or to the first surface region of the second child waveguide, to or from one of the at least two second surface regions of the second child waveguide, and a beam within a second sub-range of the second wavelength range is guided, from or to the first surface region of the second child waveguide, to or from another of the at least two second surface regions of the second child waveguide.

7. The multimode optical waveguide network of claim 1, wherein at least one of the guiding elements comprises an active guiding element, and at least another of the guiding elements comprises a guiding element responsive to the at least one beam characteristic.

8. The multimode optical waveguide network of claim 1, wherein at least one of the guiding elements comprises at least one of a wavelength or polarization filter having at least one of a fixed wavelength response, a configurable wavelength response, a fixed axis of polarization, or a configurable axis of polarization.

9. The multimode optical waveguide network of claim 1, wherein at least one of the parent waveguide, the first child waveguide, or the second child waveguide has two or more guiding elements and three or more second surface regions.

10. An optical system comprising:
a first optical system component;
second optical system components;
at least one multimode optical waveguide network, the multimode optical waveguide network arranged to guide a beam, from or to the first optical system component, to or from any selected second optical system component of the second optical system components, the at least one multimode optical waveguide network comprising:
a parent waveguide;
first and second child waveguides;
wherein each of the parent waveguide and the first and second child waveguides is a multimode optical waveguide having a first surface region, at least two second surface regions, and at least one guiding element, wherein at least one of the second surface regions of the parent waveguide is optically coupled to the first surface region of the first child waveguide, and wherein at least one other of the second surface regions of the parent waveguide is optically coupled to the first surface region of the second child waveguide; and
wherein the at least one guiding element of the parent waveguide is arranged to guide a beam, from or to the first surface region of the parent waveguide, to or from any selected second surface region of the at least two second surface regions of the parent waveguide, the beam being coupled into or received from the corresponding first or second child waveguide whose first surface region is optically coupled to the selected second surface region of the parent waveguide, via the selected second surface region of the parent waveguide and the first surface region of the corresponding first or second child waveguide, the at least one guiding element of each of the first and second child waveguides is arranged to guide a beam, from or to the first surface region of the respective first or second child waveguide, to or from any selected second surface region of its the at least two second surface regions of the respective first or second child waveguide, wherein the at least one guiding element of each of the parent waveguide and the first and second child waveguides is configurable for switching guidance of the beam between the at least two second surface regions of that waveguide via at least one of changing an optical property of the at least one guiding element or modulation of at least one beam characteristic; and
a controller configured to select a second optical system component of the second optical system components, and cause a beam to be guided, from or to the first optical system component, to or from the selected second optical system component, by at least one of configuring at least one guiding element of the multimode optical waveguide network or modulating the at least one beam characteristic.

11. The optical system of claim 10, wherein the first optical system component comprises:
- an emitter system from which a beam is emitted and guided to the selected optical second system component, or
- a detector array to which a beam is guided from the selected second system component.

12. The optical system of claim 11, wherein at least one optical system component of at least one of the first optical system component or the second optical system components comprises:
- a signal converter configured to convert a beam to an electrical signal or vice versa, or an optical processor.

13. The optical system of claim 10, wherein at least one of the guiding elements comprises an active guiding element.

14. The optical system of claim 10, wherein at least one of the guiding elements comprises an active guiding element having at least one of: a configurable transmissivity or reflectivity, a configurable refractive index, a switchable grating, or a switchable grating region.

* * * * *